(12) United States Patent
Cobb

(10) Patent No.: US 8,861,082 B2
(45) Date of Patent: *Oct. 14, 2014

(54) METHOD AND APPARATUS FOR COMBINING LASER ARRAY LIGHT SOURCES

(75) Inventor: Joshua Monroe Cobb, Victor, NY (US)

(73) Assignee: Corning Incorporated, Corning, NY (US)

( * ) Notice: Subject to any disclaimer, the term of this patent is extended or adjusted under 35 U.S.C. 154(b) by 299 days.

This patent is subject to a terminal disclaimer.

(21) Appl. No.: 13/401,196

(22) Filed: Feb. 21, 2012

(65) Prior Publication Data

US 2013/0215923 A1 Aug. 22, 2013

(51) Int. Cl.
*G02B 6/36* (2006.01)
*H01S 3/091* (2006.01)

(52) U.S. Cl.
USPC .................. 359/489.08; 385/88; 372/70

(58) Field of Classification Search
USPC ............... 359/489.08; 372/70, 72; 385/33, 88
See application file for complete search history.

(56) References Cited

U.S. PATENT DOCUMENTS

| | | | |
|---|---|---|---|
| 4,993,812 A | 2/1991 | Matsuoka et al. | |
| 5,243,619 A | 9/1993 | Albers et al. | |
| 5,508,513 A * | 4/1996 | Genovese | 250/227.26 |
| 5,513,201 A | 4/1996 | Yamaguchi et al. | |
| 5,583,683 A | 12/1996 | Scobey | |
| 5,745,153 A | 4/1998 | Kessler et al. | |
| 5,786,915 A | 7/1998 | Scobey | |
| 5,825,551 A | 10/1998 | Clarkson et al. | |
| 6,167,171 A | 12/2000 | Grasis et al. | |
| 6,198,857 B1 | 3/2001 | Grasis et al. | |
| 6,324,190 B1 | 11/2001 | Du et al. | |
| 6,377,599 B1 | 4/2002 | Marshall | |

(Continued)

FOREIGN PATENT DOCUMENTS

| | | | |
|---|---|---|---|
| DE | 3929794 | 4/1991 | |
| DE | 10328084 | 1/2005 | |
| DE | 102006050155 | 4/2008 | |
| EP | 2667238 A2 * | 11/2013 | ............. G02B 27/14 |

OTHER PUBLICATIONS

S. Zhan et al., "Eliminating dead spaces of the laser diode stack in the fast-axis direction using a plane-parallel plate array" Optical Engineering, Sep. 2007, vol. 46(9), pp. 094203-1 to 094203-5.

(Continued)

*Primary Examiner* — Frank Font
(74) *Attorney, Agent, or Firm* — Svetlana Short

(57) ABSTRACT

An apparatus for providing a light beam has a solid-state laser to emit a polarized input laser light beam that has a first aspect ratio of etendue $R_1$. First and second cylindrical lenses collimate the light along orthogonal directions. An edge of a bisecting reflective surface splits the laser light beam into a first portion directed along a first beam path and a second portion along a second beam path, wherein the first and second beam paths each contain emitted light from the solid-state laser. One or more folding reflective surfaces are disposed along the first or second or both beam paths. A polarization rotator rotates polarization of the light along the second beam path. A polarization combiner combines light from the first and second beam paths to form an output beam, wherein the output beam has a second aspect ratio of etendue $R_2$ not equal to $R_1$.

23 Claims, 29 Drawing Sheets

(56) References Cited

U.S. PATENT DOCUMENTS

| | | |
|---|---|---|
| 6,819,402 B2 | 11/2004 | Augustyn et al. |
| 7,065,105 B2 | 6/2006 | Ehlers et al. |
| 7,218,451 B2 | 5/2007 | Lee et al. |
| 7,520,641 B2 | 4/2009 | Minano et al. |
| 7,537,395 B2 | 5/2009 | Savage-Leuchs |
| 7,668,214 B2 * | 2/2010 | Wilson et al. ............ 372/23 |
| 7,762,465 B2 | 7/2010 | Knowles et al. |
| 7,764,723 B2 | 7/2010 | Ovtchinnikov et al. |
| 7,822,304 B2 | 10/2010 | Hirata |
| 7,830,608 B2 | 11/2010 | Hu et al. |
| 8,599,485 B1 * | 12/2013 | Cobb ....................... 359/629 |
| 2004/0067016 A1 | 4/2004 | Anikitchev et al. |
| 2004/0252744 A1 | 12/2004 | Anikitchev et al. |
| 2005/0088654 A1 | 4/2005 | Hu et al. |
| 2006/0182155 A1 | 8/2006 | Windpassinger et al. |
| 2007/0268946 A1 | 11/2007 | Schulte et al. |
| 2012/0307370 A1 | 12/2012 | Bhatia et al. |

OTHER PUBLICATIONS

W.A. Clarkson et al., "Novel Beam Shaping Technique for High Power Diode Bars" Optoelectronics Research Centre, University of Southhampton. Research paper, CLEO '94, Anaheim CA, May 8-13, 1994 vol. 8, pp. 360.

W.A. Clarkson et al., "Two-mirror beam-shaping technique for high-power diode bars", Optics Letters, vol. 21 No. 6, Mar. 15, 1996, pp. 375-377.

Sep. 20, 2012 International Search Report of related application PCT/US12/39919.

* cited by examiner

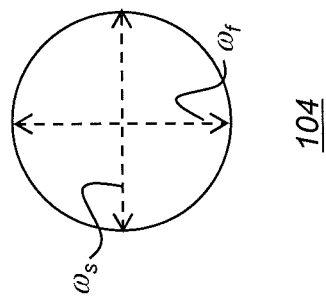
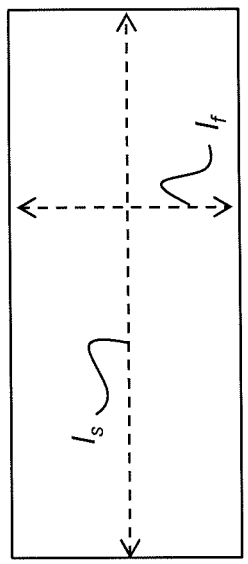
FIG. 2A1
(Prior Art)

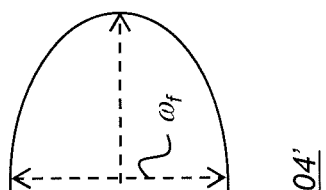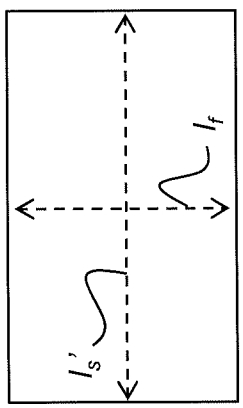
FIG. 2A2
(Prior Art)

METHOD AND APPARATUS FOR COMBINING LASER ARRAY LIGHT SOURCES

CROSS-REFERENCE TO RELATED APPLICATIONS

The present invention is related to commonly assigned U.S. patent application Ser. No. 13/118,939 entitled "METHOD AND APPARATUS FOR COMBINING LIGHT SOURCES IN A PUMP LASER ARRAY" in the name of Josh Cobb, et al. filed May 31, 2011.

FIELD OF THE INVENTION

This invention generally relates to optical apparatus for combining light from multiple sources and more particularly relates to apparatus and methods for spatial combination of multiple laser light sources for improved etendue matching.

BACKGROUND

There are many applications for combining lasers and other solid-state light sources. In general, when an application requires more power than can be delivered by a single laser source, a common solution is to combine the light from two or more lasers of the same wavelength. Since the additional lasers are in a physically different location, it becomes necessary to combine and stack the laser output beams together, eliminating as much "dead space" as possible in the combined output beam.

When lasers are combined in this manner, it is often desirable to make the combined source as small as possible (i.e., to have the smallest possible etendue) so that the energy of the combined beam can be effectively and efficiently concentrated and transferred to another optical system. Combining methods use various characteristics of the light including wavelength, polarization, and spatial characteristics.

One application for which spatial combining of multiple sources is of particular interest is in pump excitation for fiber lasers. In a fiber laser, the active gain medium is an optical fiber doped with suitable rare-earth elements. Pump energy can be provided from a number of types of sources, such as using a set of multiple laser diodes that are fiber-coupled to the gain medium. By using multiple pump sources, higher optical power can be directed to the gain medium. The use of multiple laser sources also allows each of the pump lasers to operate at a lower power level for a given amplifier gain, thereby extending the lifetime of the pump lasers and hence the reliability of the amplifier. This also provides some redundancy in the event that one of the pump lasers fails.

Because a single wavelength is needed for pump energy, the individual sources must be closely matched, making laser diodes a practical choice. However, laser diodes do not provide a beam that is circular in cross section, that is, with highly symmetrical energy distribution about a central axis. Instead, the aspect ratio of the output light is highly asymmetric, with markedly different divergence angles in orthogonal directions, generating an output beam whose length (considered to be along the "slow" axis) can be several times its width (along the "fast" axis). This asymmetric characteristic makes it desirable to stack the component output beams as closely together as possible, to form a composite beam with a more nearly symmetric aspect ratio. As a limiting factor, the input optical fiber for accepting the pump energy has a relatively small numerical aperture (N.A.), which limits the angular extent of the incoming composite beam and makes it desirable to eliminate as much dead space between component beams as possible.

Among solutions that have been implemented or proposed for combining laser sources for use as pump lasers is a modular pump module with vertically staggered laser diodes and corresponding mirrors. FIGS. 1A and 1B show top and side views, respectively, of a typical pump module 10 of this type. In this approach, each of three lasers 12a, 12b, and 12c directs a beam through a corresponding set of crossed cylindrical lenses 15a, 15b, and 15c for a first axis (the fast axis FA, as described in more detail subsequently) and 14a, 14b, and 14c for the orthogonal axis (the slow axis SA, described subsequently) and to a mirror 16a, 16b, and 16c, respectively. A filter 30 provides a measure of protection from feedback light FB, as described in more detail subsequently. A composite beam 28 that is inside a pupil 27 of a lens 18 is then focused by lens 18 into an optical fiber 20 for use as pump energy.

As the side view of FIG. 1B shows, with vertical distance intentionally exaggerated for clarity, the lasers 12a, 12b, and 12c and their corresponding cylindrical lenses 14a, 14b, and 14c and three spaced-apart mirrors 16a, 16b, and 16c are vertically staggered, by a slight distance. This arrangement of reflective components leaves little tolerance room between the component output beams. The light from laser 12a is clipped by the top of mirror 16b, for example. Similarly, the light from laser 12b is clipped by the top of mirror 16c. The inset W in FIG. 1A shows the angular distribution of composite beam 28 at the pupil of lens 18. Inset W shows how composite beam 28 is formed, with an output beam 22a' from laser 12a, an output beam 22b' from laser 12b, and an output beam 22c' from laser 12c. There is necessarily some gap distance or dead space 24 between the stacked output beams due to tolerances needed to pass the beams by the fold mirrors 16b and 16c.

While the solution described with reference to FIGS. 1A and 1B has proved to be workable, there is room for improvement. Manufacturing tolerances are tight, with little room for variability in fabrication. Each component must be precisely aligned, so that the light is properly redirected from mirrors 16a, 16b, and 16c. Because each laser reflects off a different mirror, thermal variations between the mirrors 16a, 16b, and 16c adversely affect the alignment of the system during operation. Significantly, for practical reasons, this type of solution allows only a restricted number of lasers, three or fewer, to be combined.

With conventional combining solutions, the aspect ratio of the composite output beam is poorly matched to the design of the combining system. In FIG. 1A, an inset Z shows an overlapped image 23 of each laser mode field at an input aperture 90 of optical fiber 20. Image 23 is formed from the superimposed or overlapping images of the spatial distribution of the output of the lasers, shown as images 122a', 122b', and 122c'. A number of observations can be made:

(i) Input aperture 90 is substantially filled in the slow axis SA direction of each beam. A longer beam in the SA direction would simply overfill the input aperture of the fiber in that direction.

(ii) Input aperture 90 is under-filled in the fast axis direction FA.

(iii) Inset W shows that the pupil of lens 18 in the SA direction is also filled.

The first observation (i) represents a constraint on the manufacture of lasers used for generating pump energy. Lasers that provide an even longer slow axis than those currently available could be readily manufactured and would provide higher power and efficiency; however, there is no way to take advantage of this potential capability with conventional pump module combiner designs because there is no additional capacity for light; in that axis, the fiber etendue is constrained. The second observation (ii) above shows that there is additional room in the etendue of the fiber to add more light, but this space is in the fast axis direction of the laser, which is much brighter than the slow axis. Further, there is little tolerance for alignment in the slow axis direction, since the light beam already tends to overfill the aperture in this direction.

Solutions that have been proposed for improving efficiency of the laser pump module include superimposing additional beams into the fiber, such as by changing polarization for a set of beams and overlapping the beam paths of different polarizations in order to use light from additional lasers. Such methods, however, face the same etendue-based limitations described with reference to FIG. 1A. The size of the usable laser mode field is constrained. Because the aspect ratio of the etendue of light from the laser diodes is unchanged, these solutions still place constraints on output beam dimensions. Thus, even though a longer laser diode than those currently used for laser pumping could be fabricated and would be more efficient with respect to light output and less costly, conventional light multiplexing solutions are unable to take advantage of the potential efficiency gains and reduced cost such designs could provide. One result of this etendue-based constraint is to make it impractical to provide laser diode designs having improved efficiency.

Thus, it can be seen that there is a need for a method and apparatus for spatially combining light sources that provides an improved match between the etendue characteristics of a single laser light source or of combined laser light sources and the etendue of an optical fiber, such as an optical fiber used to provide pump light energy to a laser.

SUMMARY

It is an object of the present invention to advance the art of laser beam combination. With this object in mind, the present disclosure provides an apparatus for providing a light beam, the apparatus comprising:

a solid-state laser that is energizable to emit, along an optical axis, a polarized input laser light beam that has a first aspect ratio of etendue $R_1$, wherein the optical invariant of the input laser light beam with respect to a first direction is less than half the optical invariant of the input laser light beam with respect to a second direction that is orthogonal to the first direction;

a first cylindrical lens that is disposed to collimate the polarized input laser light beam with respect to the first direction;

a second cylindrical lens that is disposed to collimate the polarized input laser light beam with respect to the second direction;

a bisecting reflective surface having an edge that is disposed along the optical axis to split the collimated polarized laser light beam, with respect to the second direction, into a first portion directed along a first beam path and a second portion directed along a second beam path, wherein the first and second beam paths each contain emitted light from the solid-state laser;

one or more folding reflective surfaces disposed along the first beam path, along the second beam path, or along both first and second beam paths;

a polarization rotator disposed to rotate polarization of the light along the second beam path; and a polarization combiner disposed to combine light from the first and second beam paths to form an output beam, wherein the output beam has a second aspect ratio of etendue $R_2$ that is not equal to $R_1$.

From another aspect, the present invention provides an apparatus for providing light to an optical fiber, the apparatus comprising:

at least first and second lasers, wherein the first laser is energizable to direct a first light beam along a first axis and the second laser is energizable to direct a second light beam along a second axis that is parallel to the first axis, wherein the first and second axes are aligned and spaced apart with respect to a first direction;

a light combining apparatus disposed to accept light along at least the first and second axes and to realign the respective axes of the first and second light beams with respect to a second direction that is substantially orthogonal to the first direction, wherein the light combining apparatus is disposed to direct a first portion of the realigned first light beam and a first portion of the realigned second light beam toward a first surface of a polarization beam splitter and onto an output axis;

one or more reflective elements that are disposed to redirect a second portion of the realigned first light beam and a second portion of the realigned second light beam toward a second surface of the polarization beam splitter and onto the output axis;

a polarization rotator that is disposed between the light combining apparatus and the polarization beam splitter and is either in the path of the first portions of each of the first and second light beams or in the path of the second portions of each of the first and second light beams; and one or more lens elements disposed to direct light from the output axis toward the optical fiber.

An advantage provided by the present invention is the capability to adjust the aspect ratio of the etendue, both for an individual light beam, and for a composite light beam that is formed from two or more combined component light beams. This enables improvements for using light from laser diodes more efficiently and can also offer advantages for alignment of a laser diode beam, such as those used to provide light for pumped lasers. Embodiments of the present invention can be retrofit to existing beam combining modules as well as to a number of innovative configurations of beam multiplexing systems.

Other desirable objectives, features, and advantages of the disclosed invention may occur or become apparent to those skilled in the art. The invention is defined by the appended claims.

BRIEF DESCRIPTION OF THE DRAWINGS

FIG. 2A1 is a plan view schematic diagram showing spatial and angular distribution for a light source with a given aspect ratio of etendue.

FIG. 2A2 is a plan view schematic diagram showing changes to spatial and angular distribution for a light source with magnification along one axis.

DETAILED DESCRIPTION

Figure 1A:
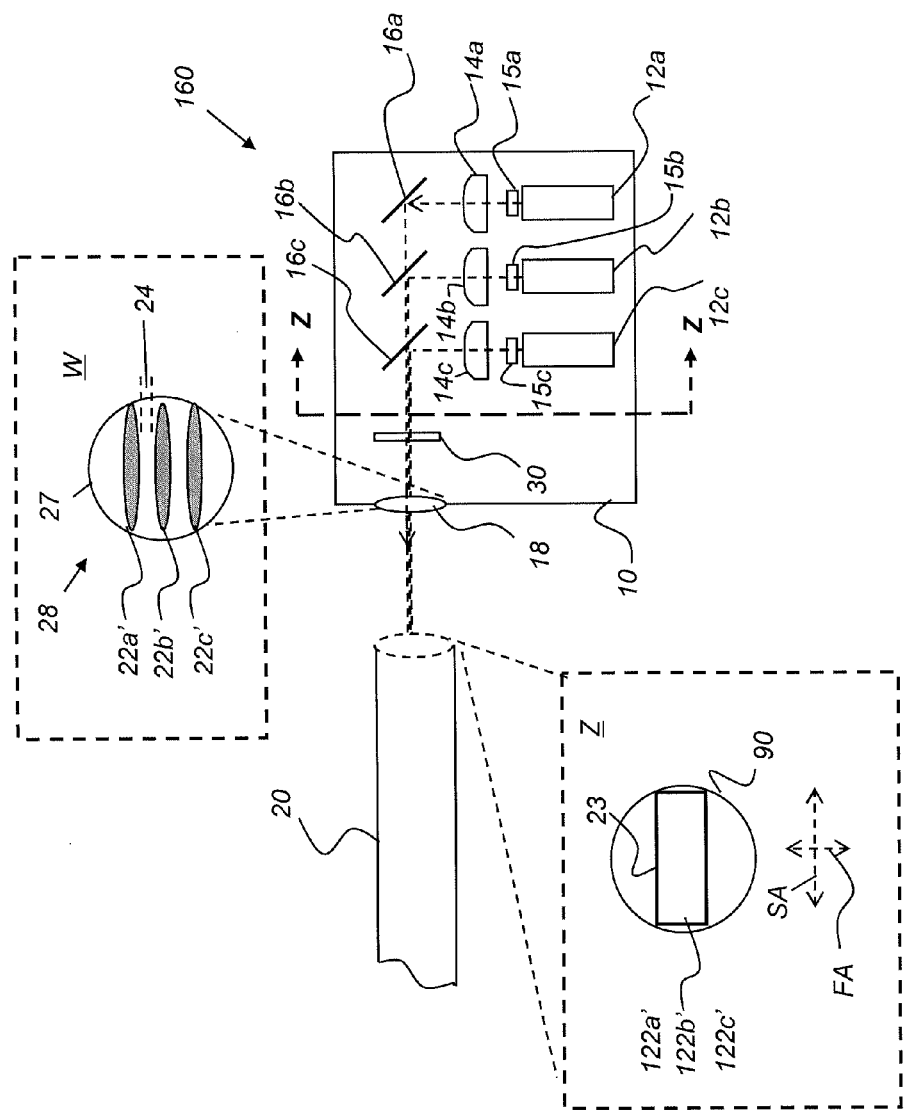
FIG. 1A is a top view block diagram of a conventional laser pump module for combining lasers to provide a composite beam.

Figures shown and described herein are provided in order to illustrate key principles of operation and fabrication for an optical apparatus according to various embodiments and a number of these figures are not drawn with intent to show actual size or scale. Some exaggeration may be necessary in order to emphasize basic structural relationships or principles of operation. For example, some coplanar structures may be shown slightly offset from each other in views where these structures overlap.

In the context of the present disclosure, terms "top" and "bottom" or "above" and "below" are relative and do not indicate any necessary orientation of a component or surface, but are used simply to refer to and distinguish opposite surfaces or different light paths within a component or block of material. Similarly, terms "horizontal" and "vertical" may be used relative to the figures, to describe the relative orthogonal relationship of components or light beams that align in different planes, for example, but do not indicate any required orientation of components with respect to true horizontal and vertical orientation.

Where they are used, the terms "first", "second", "third", and so on, do not necessarily denote any ordinal or priority relation, but are used for more clearly distinguishing one element or time interval from another. For example, there are no fixed "first" or "second" elements in what is taught herein; these descriptors are merely used to clearly distinguish one element from another similar element in the context of the present disclosure. Similarly, filter designations F1, F2, F3, and F4, where used, are assigned to identify different filters in the figures and in the description that follows, and help to identify filter function; no ordinal or priority relation or necessary sequence in the light path is implied in this part numbering.

As used herein, the term "energizable" relates to a device or set of components that perform an indicated function upon receiving power and, optionally, upon receiving an enabling signal.

In the context of the present disclosure, two planes, direction vectors, or other geometric features are considered to be substantially orthogonal when their actual or projected angle of intersection is within +/−12 degrees of 90 degrees. In the context of the present disclosure, the term "bisect" is used to denote separating a light beam into two portions; this is a less formal use of the term "bisect" than is applied in geometry proofs and does not necessarily imply that the two portions of the split beam are of equal size. In the context of the present invention, it is generally useful to bisect the beam from each laser light source into two portions so that each portion is approximately half of the beam, but even a difference of 10% or even of 25-30% or more between portions would still prove workable and can be advantageous. Thus, each of the two portions of the split light beam that is formed according to embodiments of the present invention will have at least 20% of the light from each solid-state laser light source. The beam aspect ratio is considered as it would be generally understood to those skilled in the optical arts, that is, considered orthogonally relative to the central axis of the light beam (in the plane perpendicular to the propagation direction).

In the context of the present invention, a surface considered to "reflect" or to be reflective at a certain wavelength reflects at least about 95% of incident light of that wavelength. A surface considered to "transmit" or to be transmissive at a certain wavelength transmits at least about 80% of incident light of that wavelength. Relative to optical filters, the terms "short wave pass", "short wavelength pass", and "SWP" are considered to be equivalent; similarly, terms "long wave pass", "long wavelength pass", and "LWP" are considered to be equivalent.

In the context of the present invention, the term "oblique" or phrase "oblique angle" is used to mean a non-normal angle that is slanted so that it differs from normal, that is, differs from 90 degrees or from an integer multiple of 90 degrees, by at least about 2 degrees or more along at least one axis. An oblique angle may be at least about 2 degrees greater than or less than 90 degrees using this general definition.

In the context of the present invention, a "composite beam" is formed from a set of two or more individual "component beams".

According to a broad aspect of the present invention, apparatus and methods are provided that enable changing the aspect ratio of the etendue of a light beam, whether the beam is a single beam that is emitted from a single light source or a composite beam that is formed by combining light from multiple sources. Advantageously, embodiments of the present invention provide apparatus and methods for providing laser pump light for a fiber laser or other type of laser as a composite beam formed from light emitted by a plurality of laser sources. Embodiments of the invention may further provide filter protection of the pump laser sources from leakage light of the fiber laser or other type of pumped laser. Alternate embodiments of the present invention may also serve to condition a light beam in other environments where it is advantageous to be able to adjust the aspect ratio of the etendue of the light beam.

In order to better understand what is meant by the phrase "aspect ratio of the etendue", it is useful to more clearly define etendue and a number of related terms and principles. As is well known in the optical arts, etendue expresses the amount of light contained within the product of the cross-sectional area of the source and the solid angle of the emission of the source and relates to the amount of light that can be handled by an optical system. Etendue cannot decrease in an optical system without the loss of light. Within an optical system, etendue is considered with respect to its spatial distribution and its angular distribution. Etendue can be considered as a geometrical property, a product of two factors: spatial area (A) and angle ($\Omega$).

In an optical system, efficient use of light requires matching the etendue of components along the light path so that all of the light is used. For an optical system that is rotationally symmetric throughout, etendue computation and handling considerations are fairly straightforward. Considered in cross-section, taken at a plane that is orthogonal to the central axis of a rotationally symmetric light beam, the beam is circular and the optical invariant in any direction within the plane is the same. Etendue-matching for components within such an optical system then becomes a problem of simply scaling the spatial and angular extent of the light beam appropriately.

Etendue-matching becomes considerably more complex when the spatial distribution of the light in each axis must be changed within the optical system. This problem must be addressed, for example, in directing light from a laser diode, with its highly asymmetric etendue characteristics, into an optical fiber that is highly symmetric with respect to etendue.

Figure 2A:
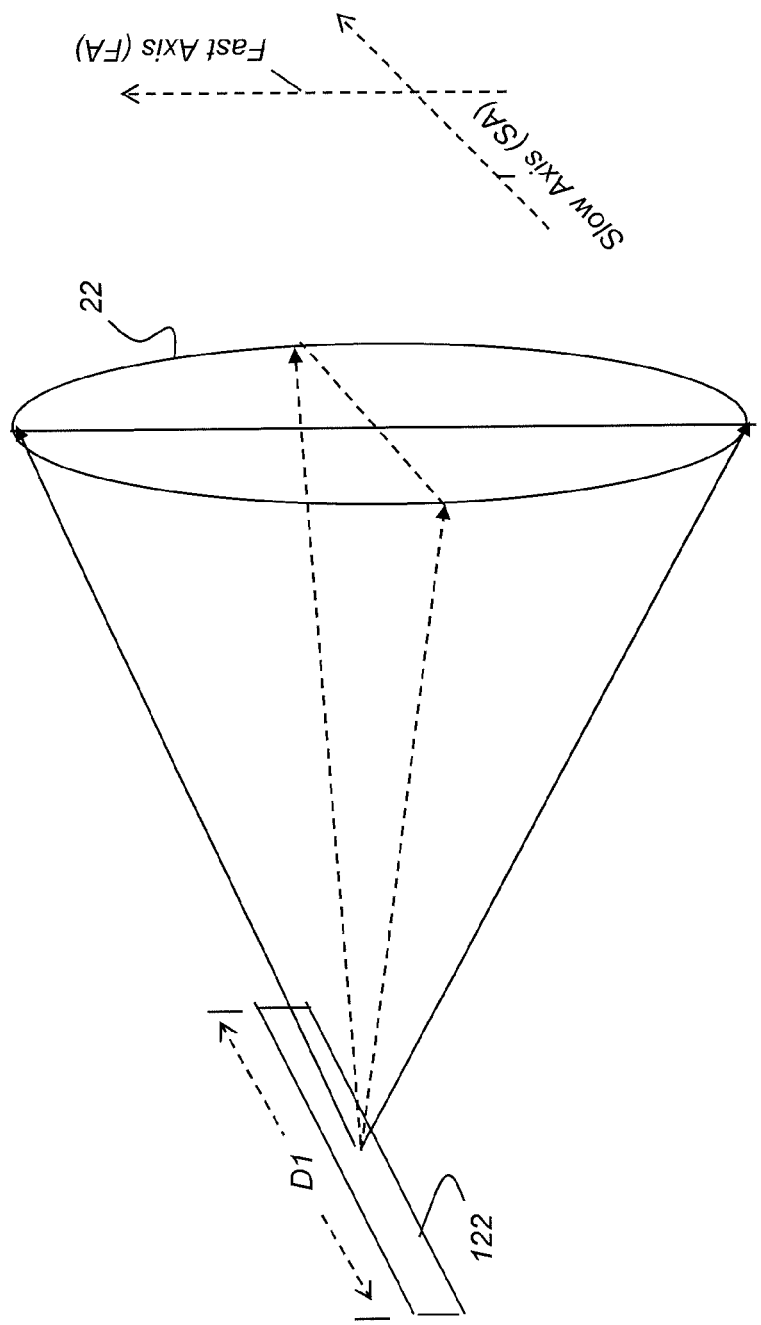
FIG. 2A is a schematic diagram that shows the asymmetry of the laser diode output beam.

As was noted previously in the background section and represented in FIG. 2A, for laser diodes that are used for laser pump light, the etendue of the solid-state laser diode is markedly asymmetric. FIG. 2A shows, in schematic form, the output from a typical multi-mode laser diode. The laser has a spatial distribution 122, shown at the laser output coupler, and an angular distribution 22, shown for the emitted light.

To facilitate description in the context of the present disclosure, the term "optical invariant" is used when describing etendue with respect to a single direction. With reference to a representative spatial distribution 102 and corresponding angular distribution 104 of a light beam in FIG. 2A1, for example, there is an optical invariant L in each of the two mutually orthogonal directions shown; that is, there is an optical invariant $L_s$ along a slow axis (SA):

$$L_s = (l_s \cdot \omega_s)$$

wherein $(l_s)$ is the length dimension of the spatial distribution in the slow axis direction and $(\omega_s)$ is the divergence angle of the light beam, taken in the slow axis direction;

and a different optical invariant $L_f$ along the fast axis (FA).

$$L_f = (l_f \cdot \omega_f)$$

wherein $(l_f)$ is the length dimension of the spatial distribution in the fast axis direction and $(\omega_f)$ is the divergence angle taken in that direction;

The total etendue E for this light beam from a given light source can be considered as the product:

$$E = (L_s \cdot L_f).$$

In the context of the present disclosure, the "aspect ratio of the etendue", denoted R herein, is the quotient:

$$R = (L_s)/(L_f)$$

Equivalently, $$R = (l_s \cdot \omega_s)/(l_f \cdot \omega_f)$$

It can be noted that, for a light beam that is rotationally symmetric, the aspect ratio of the etendue R=1. Embodiments of the present invention address the difficulties encountered when the aspect ratio of the etendue R is other than 1 for a light beam, where the aspect ratio of the etendue R is substantially 1 for an optical fiber or other optical component to which the light beam is directed.

It must further be observed that a lens cannot be used to change the aspect ratio of the etendue R. When the light beam is directed through a lens, the aspect ratio of the etendue R remains constant. This applies for spherical lenses (lenses having power in both dimensions) and cylindrical lenses (lenses having power in one dimension) as well. FIG. 2A2 shows, in schematic form, what happens when a cylindrical lens is used to reduce the spatial distribution along dimension $(l_s)$. The resulting spatial distribution 102' shows dimension $(l_s)$ reduced from that in FIG. 2A1; however, the corresponding angular distribution 104' shows the angular extent increased in a corresponding manner. When a cylindrical lens is used, the aspect ratio of the etendue R is preserved; that is:

$$R = (l_s \cdot \omega_s)/(l_f \cdot \omega_f) = (l_s' \cdot \omega_s')/(l_f \cdot \omega_f)$$

Embodiments of the present invention address the need to change the aspect ratio of the etendue R of an individual beam of light from a light source without loss of light. As one benefit, scaling the aspect ratio of the etendue $R_{in}$ of an individual beam of light enables improved adaptation of an input light source, such as a laser diode that has a highly asymmetric aspect ratio of the etendue $R_{in}$, to an output, such as an optical fiber that has an aspect ratio of the etendue $R_{out}$ that is highly symmetrical. The principles and methods used to scale the aspect ratio of the etendue R of an individual light beam are then similarly applied to composite light beams that are formed by combining individual light beams from their respective light sources.

The laser diode is an emissive component that characteristically has a significantly larger optical invariant $L_s$ along its longer slow axis (SA) direction, so that its optical invariant along that axis generally comes close to, or even exceeds, that of the optical fiber. The optical invariant $L_s$ in the SA direction is thus a limiting factor for efficient beam combination.

The laser diode has a small optical invariant $L_f$ along its narrower fast axis (FA) direction, which is often a single spatial mode. This is characterized by a small spatial dimension, as shown in FIG. 2A as spatial distribution 122, and a large (or fast) angular spread. Emission in the slow axis (SA), on the other hand, with diode length D1, contains a number of spatial modes. SA emission typically has a much larger spatial distribution and a small (slow) angular spread. This light must be coupled into an optical fiber. Unlike the laser output shown in FIG. 2A, the etendue of the optical fiber, with a circular aperture of the fiber core and a rotationally symmetric numerical aperture, is symmetric, making it difficult to use this generated light efficiently.

By way of example, and not of limitation, typical nominal values for pump laser design include the following:
Optical fiber diameter: 105 um
Optical fiber numerical aperture: 0.15
Optical fiber optical invariant in each axis proportional to: 0.15×0.105 mm*rad=0.01575 mm*rad
Laser source optical invariant $L_s$ (along the slow axis): about 0.015 mm*rad
Laser source optical invariant $L_f$ (along the fast axis): about 0.0014 mm*rad each; with a bank of four lasers stacked in the fast axis direction, 0.0056 mm*rad Since the optical invariant $L_f$ of the laser in the fast axis is so much smaller than the fiber invariant, there is plenty of room to capture the light along that axis. In the example computations shown above, the slow axis optical invariant $L_s$ exceeds the fast axis optical invariant $L_f$ by more than a factor of 10. Here, in the fast axis, the optical invariant of the optical fiber is about 2.8 times the optical invariant generated by stacking the light beams from four lasers. However, the optical invariant $L_s$ of the laser in the slow axis, on the other hand, is very close to the invariant of the fiber. Thus, alignment in that direction is more critical.

As mentioned in the background section, FIG. 1A illustrates a conventional method of multiplexing lasers. In these systems, the spatial mode field 122 of each laser (as shown in FIG. 2A) is imaged to the core 90 of the fiber 20. As inset Z of FIG. 1A shows, the superimposed images of the mode fields, 122a', 122b', 122c' (the respective mode field of each laser 12a, 12b, and 12c) are then incident inside the core 90 of the fiber. As shown in inset W, the angular distributions of the lasers are collimated and stacked on top of each other to form the output beam 28 at pupil 27 for lens 18. This output beam, 28, is composed of the collimated and redistributed angular distributions of the lasers, shown as beams 22a', 22b', 22c'. For efficient use of this light, all of the light must be contained inside the pupil 27 of lens 18.

As is readily seen, there is room for light along the fast axis. Thus, adding a fourth laser to the arrangement shown in FIG. 1A helps to fill in unused space in the fiber lens pupil 27 in the fast axis. This is one way to increase the output power of the system. However, there is no room allowed by the fiber etendue to add more light in the slow axis. Extending the length D1 of the laser diode, for example, has no advantage with the conventional multiplexing arrangement as shown in FIG. 1A. Thus, it is not feasible to increase the length D1 of the laser emitter in the slow axis and effectively capture that light in the fiber 20.

Figure 2C:
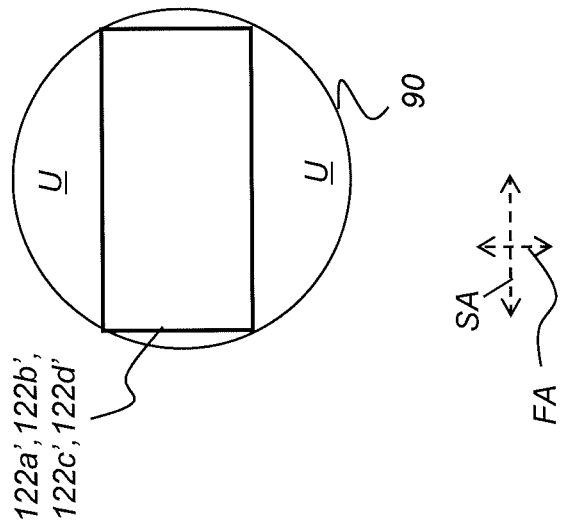
FIG. 2C is a plan view diagram that shows the composite beam of four laser sources as imaged onto the optical fiber.
Figure 2B:
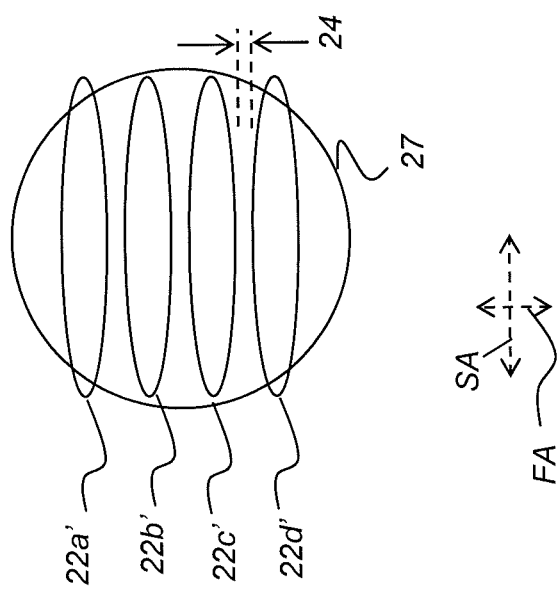
FIG. 2B is a plan view diagram that shows a composite beam in cross section, formed using four laser sources, at the pupil of a fiber lens.

The schematic block diagram of FIG. 2B shows four laser output beams 22a', 22b', 22c', and 22d' arranged in the input aperture, pupil 27 of lens 18. Because of the asymmetrical aspect ratio of the etendue of the output beams, the top and bottom output beams 22a' and 22d' overfill the pupil, so that some light is lost and misdirected within the optical system. In theory, this aspect ratio could be altered by magnification; the angular distribution in pupil 27 could be made smaller in the slow axis and thus it would fit inside pupil 27. However, this would increase the image of the mode fields in the core of the fiber 90. FIG. 2C shows how the overlapped images 122a', 122b', 122c', and 122d' of the mode fields are superimposed on core of fiber 90. Clearly, if the angular distribution, 22a', were to be magnified to be smaller, the corresponding spatial distribution, 122a', would be magnified to be larger and would overfill the fiber core. As shown in FIG. 2B, closing up dead space 24 that corresponds to the fast axis (FA) direction can help to remedy the overfill problem in part, but requires tighter alignment tolerances to stack the beams and runs the risk of clipping some energy at the edges of the beams in the fast axis.

Unlike conventional beam combining approaches, embodiments of the present invention address the problem of etendue matching by changing the aspect ratio of the etendue of each component beam that is part of the composite beam. After the composite beam is formed by the light combiner, a first portion of the composite beam, containing some of the light from each of the component beams, is re-positioned or re-distributed, overlaid onto a second portion of the composite beam, also containing light from each of the component beams, effectively reducing the proportion of light along the fast axis (FA) to light along the slow axis (SA) and thus changing the aspect ratio of the composite beam by changing its spatial distribution. In combining light beams in this manner, embodiments of the present invention thus change the aspect ratio of the etendue of the composite beam by changing the aspect ratio of the etendue of each individual component light beam that is used to generate the composite beam. As a result, since the etendue of each component beam can be re-shaped, practical constraints on the length of the laser diode (D1 in FIG. 2A) are eased. The individual laser diodes can thus be fabricated at longer lengths for improved efficiency and lower cost over conventional solutions. Embodiments of the present invention can be beneficial in applications wherein the aspect ratio of the etendue of the laser light source is asymmetric, such as when the slow axis optical invariant $L_s$ exceeds the fast axis optical invariant $L_f$ by more than a factor of 2. Thus, embodiments of the present invention are generally more advantageous when the optical invariant with respect to a first direction is less than half the optical invariant with respect to a second direction that is orthogonal to the first direction and this benefit tends to increase with an increase in the difference between the optical invariants in orthogonal directions.

Figure 3A:
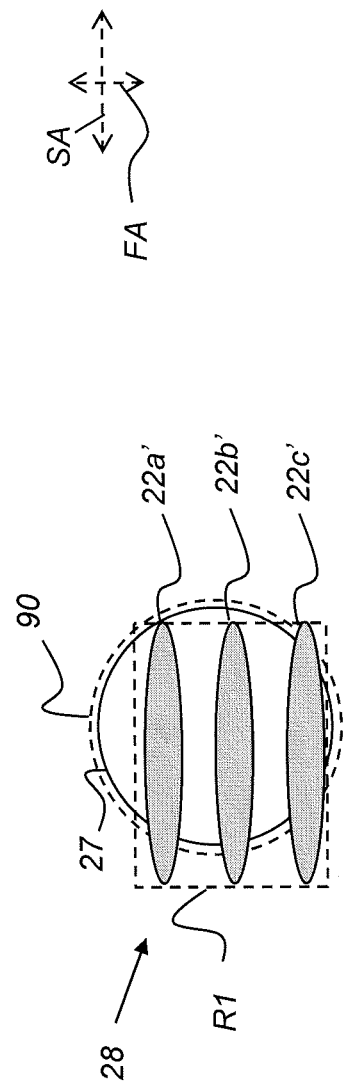
FIG. 3A is a plan view showing a composite beam and its initial aspect ratio.
Figure 3B:
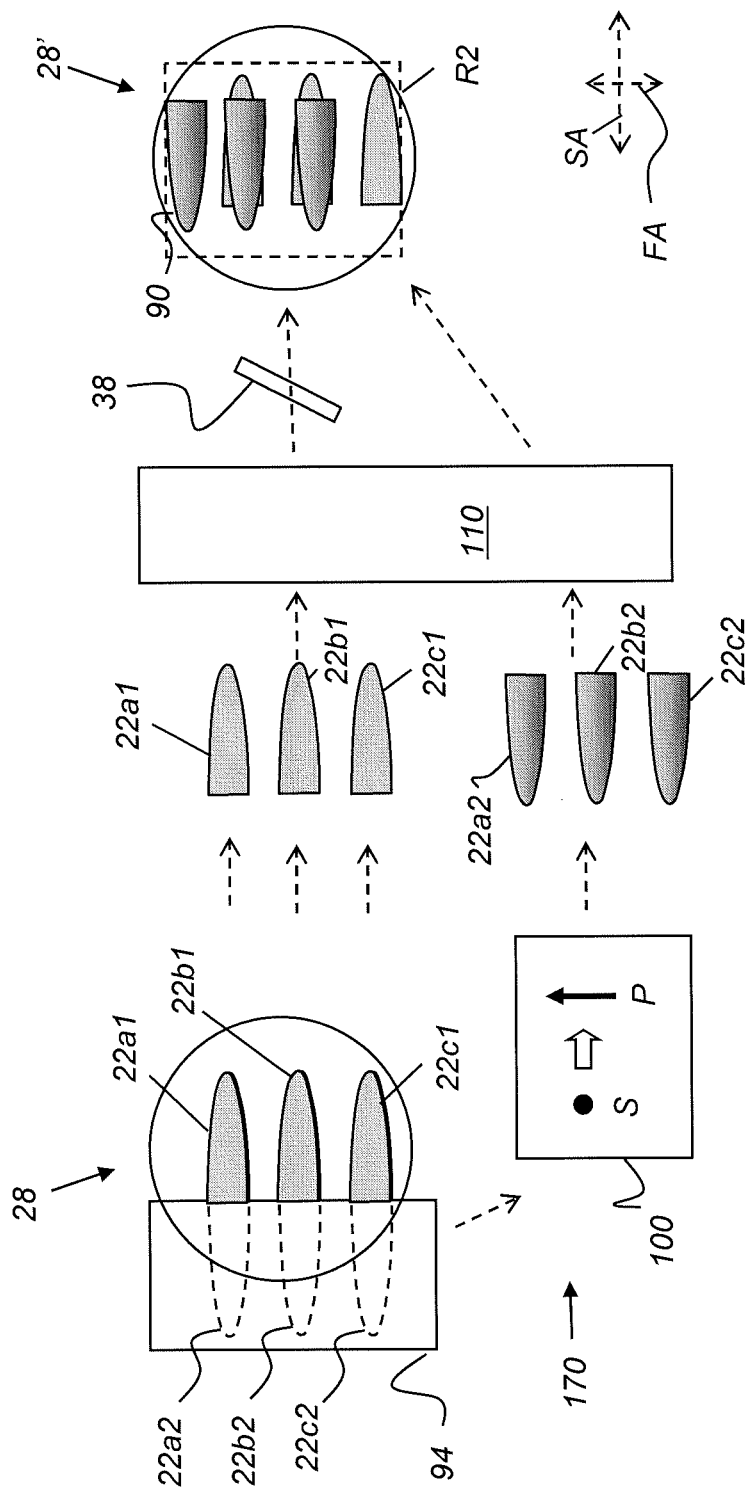
FIG. 3B is a diagram showing a sequence whereby the aspect ratio of the etendue of the composite beam is changed according to embodiments of the present invention.

The plan view diagrams of FIGS. 3A and 3B show, in sequential form and exaggerated to show basic principles, how the aspect ratio of the etendue of composite beam is changed according to embodiments of the present invention. FIG. 3A shows composite beam 28 that is formed by stacked output component beams 22a', 22b', and 22c', such as using pump module 10 of FIG. 1A or 1B or using some other type of light combiner, such as those described subsequently. Composite beam 28 has an aspect ratio of the etendue R1 according to the proportion of light along the fast axis to light along the slow axis (FA:SA). In the example shown, the SA dimension of composite beam 28 exceeds the input aperture 27 of the pupil of lens 18, as shown. The size of the pupil of lens 18 is governed by the numerical aperture of fiber 20 (FIG. 1A). This means that the etendue or optical invariant for at least one laser, in the SA direction, exceeds the optical invariant of the optical fiber. With conventional laser multiplexing solutions, this relationship means wasted light, overfilling input aperture 27. Embodiments of the present invention, on the other hand, allow the use of light that would otherwise be excessive with conventional approaches.

Turning to FIG. 3B, it can be seen how embodiments of the present invention re-distribute light from each component beam of composite beam 28 to provide a composite beam 28' that has an improved aspect ratio of the etendue R2, so that composite beam 28' more closely matches the etendue or optical invariant of the fiber. One or more bisecting reflective elements 94 disposed in the path of composite beam 28 bisect or split each individual component beam of this composite beam so that a portion of the composite beam, consisting of portions 22a2, 22b2, and 22c2 in the example shown, is redirected. In the schematic representation of FIG. 3B, the redirected portion is directed toward a polarization rotator 100, such as a half wave plate. As part of a polarization light combining apparatus 170, a polarization rotator 100 rotates the polarization of the redirected portion of light so that its polarization is orthogonal to that of the original composite beam 28. The remaining portions 22a1, 22b1, and 22c1 that have not been redirected are unchanged in polarization. A polarization combiner 110 then recombines portions 22a1, 22b1, and 22c1 with portions 22a2, 22b2, and 22c2 that can be at least partially overlaid on each other to form composite beam 28' with an improved aspect ratio R2. It must be observed that either one or the other portion of the original composite beam 28 is directed through polarization rotator 100; this may be the "redirected" portion as shown in FIG. 3B or the portion that is not redirected by reflective element 94, as described subsequently for particular embodiments. Polarization combiner 110 can have any of a number of embodiments, including a polarization beamsplitter as described in more detail subsequently.

As FIG. 3B also shows, one or more optional tilted plates 38 can be disposed in the path of either portion of the split composite beam 28 in order to adjust the relative alignment of the set of beam portions in the stacking direction (vertical in the view of FIG. 3B).

Figure 4A:
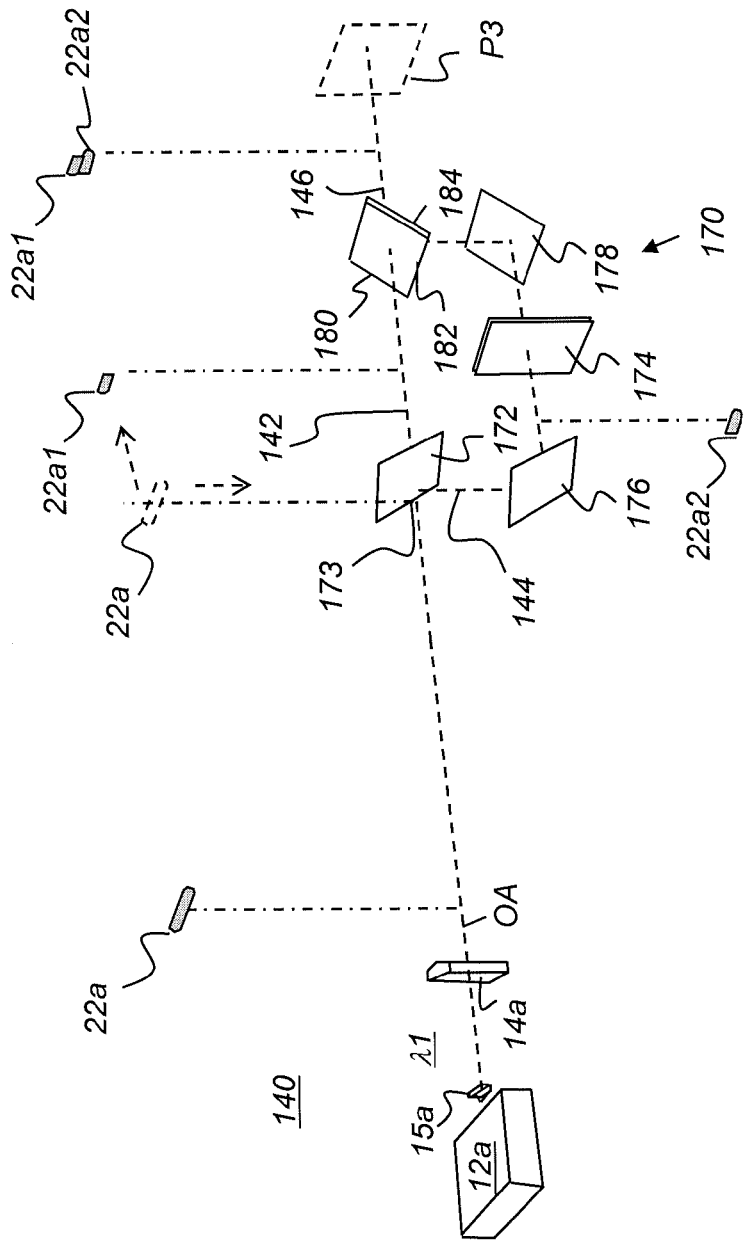
FIG. 4A is a perspective schematic view showing components of an optical apparatus for changing the aspect ratio of the etendue for a single laser beam.
Figure 4B:
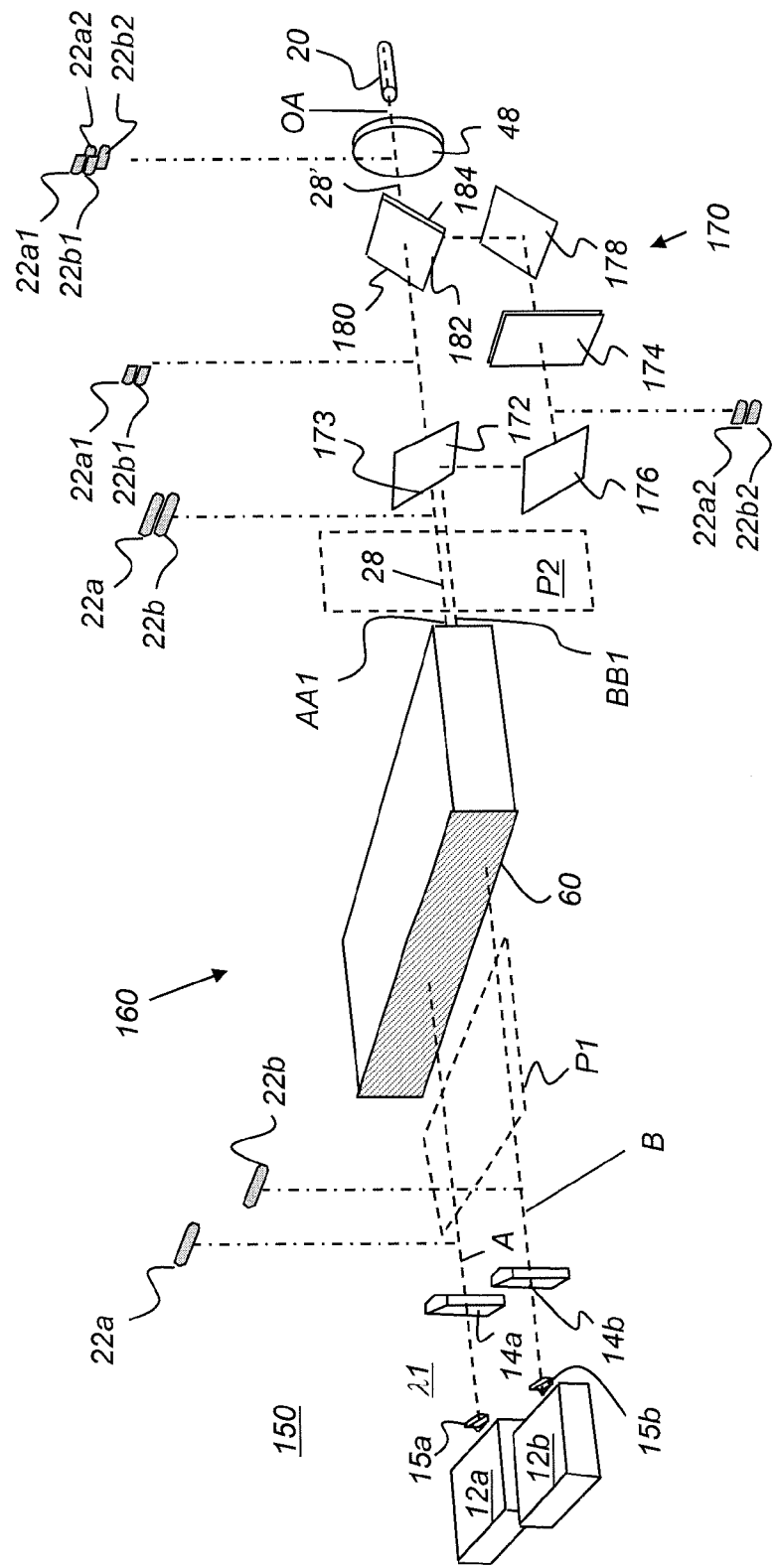
FIG. 4B is a perspective schematic view showing components of an optical system for forming a composite beam and changing the aspect ratio of the etendue of each component beam in the composite beam using the sequence outlined in FIG. 3B.

The perspective schematic drawing of FIG. 4A shows an optical apparatus 140 that can be used for changing the aspect ratio of the etendue of a single beam of laser light from a single laser 12a. FIG. 4B then shows an optical apparatus 150 that can be used to combine two or more laser light sources to form a composite output beam 28' that has an improved aspect ratio for input to optical fiber 20, using the light processing sequence shown in FIGS. 3A and 3B.

In the embodiment shown in FIG. 4A, a single solid-state laser 12a is energizable to emit, along optical axis OA and through cylindrical lenses 15a and 14a, a polarized input laser light beam 22a that has a first aspect ratio of etendue $R_1$, computed as previously described. Cylindrical lens 15a provides collimation along the fast axis FA. Cylindrical lens 14a provides collimation along the slow axis SA, orthogonal to FA, as shown with reference to FIG. 2A. A bisecting reflective surface 172, oblique to optical axis OA, has an edge 173 that is disposed along the optical axis and that bisects the emitted laser light beam, with respect to the SA direction, into two portions 22a1 and 22a2, each portion directed along a separate beam path, shown as first and second beam paths 142 and 144. With the single laser light beam bisected in this way, the first and second beam paths 142, 144 each contain collimated emitted light from the solid-state laser 12a. FIG. 4A shows portion 22a2 directed to one or more folding reflective surfaces 176, 178 that fold the beam path 144 and direct portion 22a2 light through a polarization rotator 174, such as a half wave plate. Light from both beam paths 142 and 144 is then directed to a polarization combiner, shown as a polarization beam splitter 180, that is disposed to combine light from the first and second beam paths 142, 144 to form an output beam 146 that is directed toward an output plane P3. Light from beam path 142 goes to one surface of polarization beam splitter 180; light from beam path 144 goes to the opposite surface of polarization beam splitter 180. A lens or other optical element is typically positioned at plane P3. The shifted position of portions 22a1 and 22a2 in output beam 146 yields an aspect ratio of etendue $R_2$ for the output beam that is different from the first aspect ratio of etendue $R_1$ of the emitted laser light beam.

FIG. 4B extends the basic approach of FIG. 4A for scaling the aspect ratio of etendue of a single beam to the problem of scaling the aspect ratio of the etendue for a composite beam of the same wavelength formed from the light of two or more solid-state laser diode emitters. First laser 12a is energizable to provide a first light beam of wavelength λ1 through orthogonal cylindrical lenses 15a and 14a and along a first emission axis A toward a light combining apparatus 60 that operates as a spatial light combining apparatus 160. At least a second laser 12b is energizable to provide a second light beam, also of wavelength λ1, through corresponding lenses 15b and 14b and along a second emission axis B, parallel to and spaced apart from first axis A, and toward light combining apparatus 60. Emission axes A and B are aligned with respect to a first direction; alternately, it can be stated that emission axes A and B lie within or define a first plane P1. The first and second light beams along axes A and B are both asymmetric in cross-section, as was described with reference to FIGS. 2A and 3A, so that both have a beam slow axis (SA) dimension, in a first direction that is substantially parallel to the plane P1 in FIG. 4B, that is at least more than twice a beam fast axis (FA) dimension, in a second direction that is substantially orthogonal to the plane P1. Spatial light combining apparatus 160 forms composite beam 28, wherein the light of the first and second lasers is aligned along a third axis AA1 and a fourth axis BB1, respectively, that define a second plane P2 that is substantially orthogonal to the first plane P1. In this way, axes A1 and B1 are realigned with respect to a second direction that is substantially orthogonal to the first direction that was described with reference to plane P1. In a polarization light combining apparatus 170, a first portion of the composite beam 28 is directed toward a first surface 182 of a polarization beam splitter 180 and onto an output axis OA. A reflective element 172 has edge 173 that bisects the composite beam 28 and redirects a second portion of composite beam 28 through one or more wave plates that provide the polarization rotator 174 described with reference to polarization rotator 100 in FIG. 3B and toward a second surface 184 of polarization beam splitter 180, which acts as polarization combiner and provides the combined beam on the output axis OA. One or more additional reflective surfaces, shown as 176 and 178 in FIG. 4B, are used to fold the light path and guide the redirected light within polarization light combining apparatus 170. One or more lens elements 48 are disposed to direct light from the output axis OA toward optical fiber 20.

It must be emphasized that the FIGS. 4A and 4B arrangements are unlike other techniques that use polarization to combine one set of beams with another. Forming a composite beam by superimposing component beams of different polarization states, embodiments of the present invention redistribute the light energy by modifying the aspect ratio of etendue for each of the individual component beams themselves. By bisecting each component beam along its longer slow axis (SA) dimension, embodiments of the present invention compensate for beam asymmetry and can dramatically improve the aspect ratio of etendue of the final composite beam. This also allows the efficient use of one or more laser diodes that emit beams whose optical invariant along the slow axis direction exceeds that of the optical fiber 20. This capability has not been available with conventional beam combining solutions, effectively placing a constraint on laser diode design.

Figure 1B:
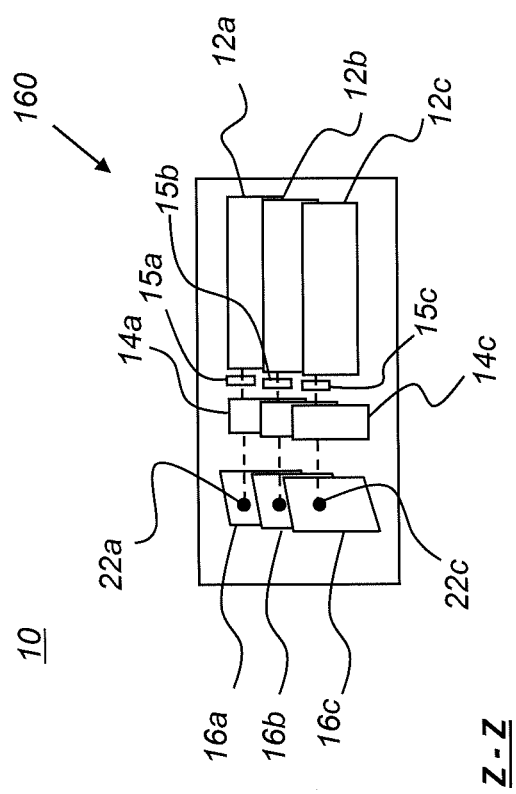
FIG. 1B is a side view block diagram of the conventional laser pump module shown in FIG. 1A for combining lasers to provide a composite beam.

FIGS. 1A and 1B showed pump module 10, which is one type of spatial light combining apparatus 160 that can be used as part of optical apparatus 150 as described with reference to FIG. 4B. Using such a conventional light combining component requires addition of the polarization light combining apparatus 170 components: polarization beam splitter 180, polarization rotator 174, and two or more of the reflective elements 172, 176, and 178 that fold the optical path as shown in FIG. 4B.

Figure 5A:
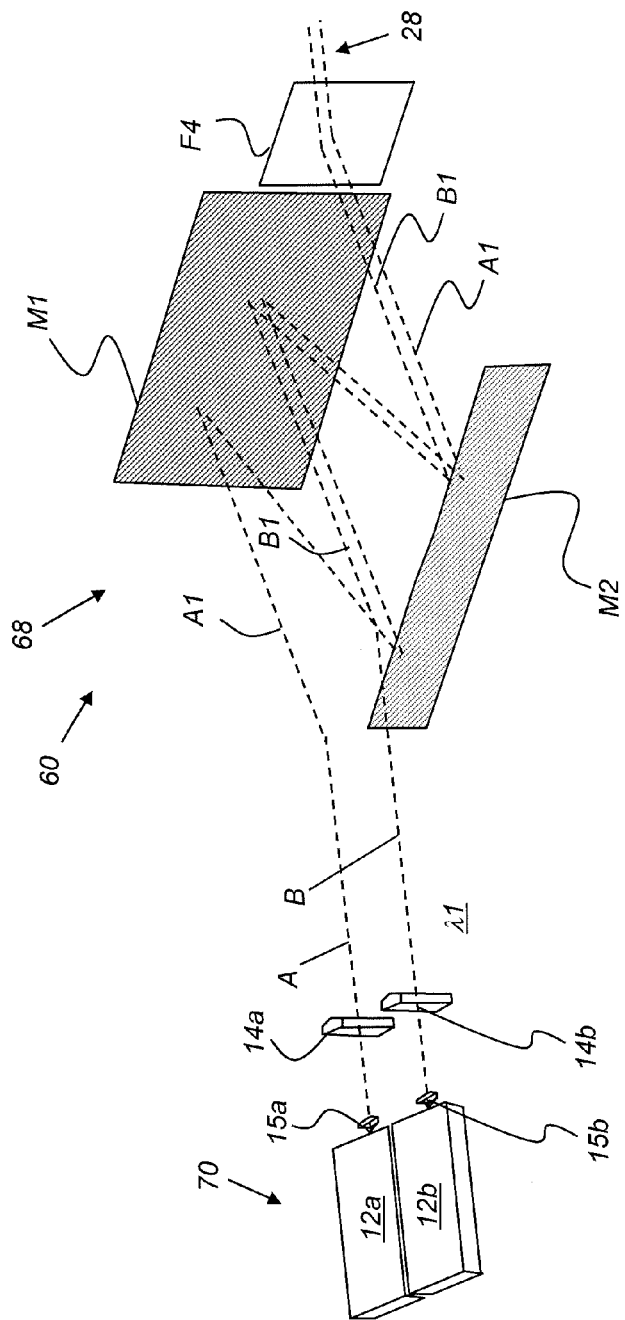
FIG. 5A is a simplified perspective schematic view showing components of an optical system for forming a composite beam using a pair of reflective surfaces consistent with an embodiment of the present invention.

FIG. 5A and following show alternate embodiments of a combining apparatus 60 formed on a transparent substrate that can be used in place of pump module 10 as spatial light combining apparatus 160. The simplified schematic diagram of FIG. 5A shows components of combining apparatus 60 that uses a pair of reflective surfaces M1 and M2 for realignment of component beam light axes and forming composite beam 28. In FIG. 5A, distances between reflective surfaces are exaggerated to show principles of light path redirection. Reflective surfaces M1 and M2 could be mirrored surfaces separated by air or could be formed on opposite surfaces of a solid transparent body 68, such as a glass plate or block, which is removed for better visibility of light paths in FIG. 5A, but is shown in subsequent embodiments. For the purpose of showing principles of operation, only two lasers 12a and 12b are shown, each energized to direct light through corresponding cylindrical lenses 15a, 14a and 15b, 14b along corresponding emission axes A and B, respectively. Lasers 12a and 12b both emit light of wavelength λ1, used to provide laser pump light. Reflective surfaces M1 and M2 are formed and arranged to selectively keep the emitted light of wavelength λ1 within the path shown in FIG. 5A. Mirrors M1 and M2 can be formed on opposite surfaces of solid transparent refractive body 68, causing refraction of the light paths so that axis A is refracted to a redirected axis A1 within refractive body 68 and axis B is refracted to a redirected axis B1 within refractive body 68. An optional filter F4 is provided to block feedback light of wavelength λ2 from the pumped laser, preventing light of this wavelength from reaching lasers 12a and 12b. It can be readily appreciated that additional lasers can be added using the arrangement of FIG. 5A, allowing composite beam 28 to have two, three, four, or more stacked laser light beams for delivery of pump light to the pump laser.

Figure 5B:
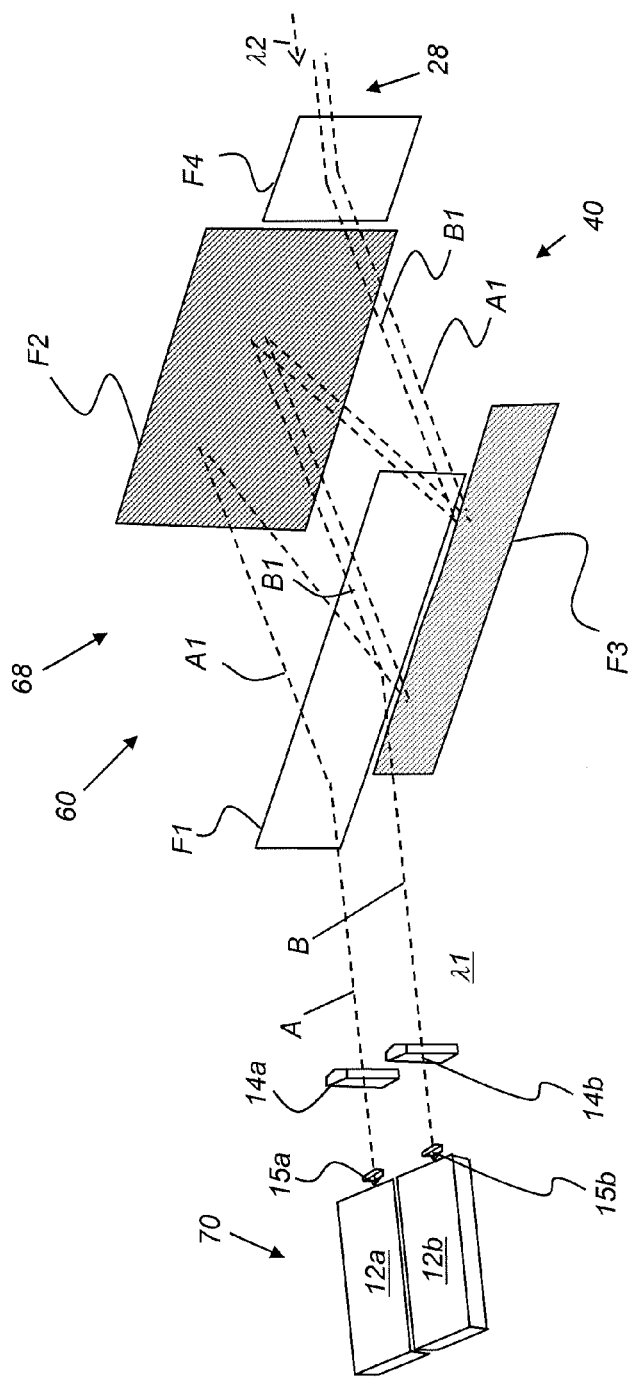
FIG. 5B is a simplified perspective schematic view that shows operating principles of a filter apparatus for forming a composite beam consistent with an embodiment of the present invention.

Subsequent embodiments of combining apparatus 60 begin from the basic arrangement of opposed reflective surfaces shown in FIG. 5A, with optional enhancements for improved filtering of the pump light and for attenuation and removal of unwanted feedback light from the lasers. Referring to FIG. 5B, there is shown combining apparatus 60 that uses a filter apparatus 40 and shows the related paths for laser light, with filters that attenuate unwanted wavelengths and realign the light by reflection to form composite light beam 28. As with FIG. 5A, distances between filter surfaces are exaggerated and the solid refractive body 68 is not shown to better illustrate principles of light path redirection. For the purpose of showing principles of operation, only two lasers 12a and 12b are shown, each energized to direct light to combining apparatus 60 through a pair of cylindrical lenses 15a and 14a, 15b and 14b along a corresponding emission axis A and B, respectively. Lasers 12a and 12b emit light of wavelength λ1, used to provide laser pump light through an optical fiber 20. Filters F1, F2, F3, and F4 are formed and arranged to selectively keep wavelength λ1 within the path shown in FIG. 5B and to remove wavelength λ2, feedback light from the pumped laser, from the light path. Filters F1-F4 are formed on surfaces of solid transparent refractive body 68, such as a glass plate or block, causing refraction of the light paths so that axis A is refracted to a redirected axis A1 within refractive body 68 and axis B is refracted to a redirected axis B1 within refractive body 68. Optional first filter F1 is a short wavelength pass filter disposed at an oblique angle to the first and second axes A and B and is transmissive to the shorter wavelength λ1 and reflects the longer wavelength λ2. A second filter F2 is spaced apart from and parallel to filter F1. Filter F2 is a long wavelength pass filter that reflects the shorter wavelength λ1 and transmits the longer wavelength λ2. A third long wavelength pass filter F3 is coplanar to optional short wavelength pass filter F1 and reflects λ1 and transmits λ2. A fourth short wavelength pass filter F4 is transmissive to shorter wavelength λ1 and reflects longer wavelength λ2. With proper spacing of components, filter apparatus 40 re-aligns redirected axes A1 and B1, initially aligned along a first direction, along a second direction that is substantially orthogonal to the first direction of axes A and B. Coplanar has its conventional meaning; parallel first and second thin-film filters can be considered to be coplanar if any layer of the first filter extends along the same plane that contains any layer of the second filter.

In the description and examples given herein, the pump laser 12a, 12b wavelength λ1 is assumed to be less than the pumped laser wavelength λ2. This is typically the case with pump lasers; however, it can be readily appreciated that the filter apparatus 40 of the present invention can be designed for the alternative situation, in which λ1 exceeds λ2, with corresponding changes to filter F1-F4 spectral characteristics. In either situation, filters F1, F2, F3, and F4 can be formed and arranged to selectively keep wavelength λ1 within the path shown in FIG. 5B and to remove wavelength λ2 from the path.

The two-laser model of FIG. 5A can be extended to allow three or more energized lasers to be combined, with optional filtering further extended to protect the additional pump lasers from feedback light energy. Referring to the perspective block diagram of FIG. 5C and corresponding top view of FIG. 5D and rear view of FIG. 5E, there is shown a combining apparatus 60 for a laser pump module using filter apparatus 40 consistent with an embodiment of the present invention. Each of pump lasers 12a, 12b, and 12c in a pump laser array 70 emits light toward an incident surface 36 of filter apparatus 40. Pump laser 12a emits along an emission axis A; pump laser 12b emits along an emission axis B; and pump laser 12c emits along an emission axis C. Pump lasers 12a, 12b, and 12c emit light at a first wavelength λ1; this light is used as pump light to a pumped laser that emits light at a second wavelength λ2, shown in FIG. 5D. Pumped laser light is typically at a longer wavelength than the pump light provided. The pumped laser is a fiber laser according to one embodiment of the present invention. The light from each laser 12a, 12b, and 12c is directed through its corresponding pair of mutually orthogonal cylindrical lenses 15a, 14a; 15b, 14b; and 15c, 14c, respectively. Filter apparatus 40 is formed on a transparent body or plate 42, such as a glass plate. The light of first wavelength λ1 is transmitted through optional short wavelength pass filter F1 and enters the refractive material of transparent plate 42. With subsequent reflection between long wavelength pass filters F2 and F3 within filter apparatus 40 and with sequential filtering at short wavelength pass filter F4, the laser beams, initially transmitted in parallel and aligned with each other in a first plane or first direction, are realigned with each other along a second plane or second direction that is substantially orthogonal to the first plane, that is, within no more than about +/−12 degrees from orthogonal. Any stray feedback light FB from the pumped laser, at second wavelength λ2, is removed from the light path within filter apparatus 40 by reflection from short wavelength pass filter F4, transmission through long wavelength pass filters F3 and F2, and reflection from optional short wavelength pass filter F1. This rejection of feedback light FB emulates the protective effect of multiple stacked or cascaded filters using the surfaces of filter apparatus 40. It should again be noted that filters F1-F4 are optional and reflective surfaces M1 and M2 can alternately be used, as described previously with respect to FIG. 5A, instead of or in combination with one or more optional filters.

Figure 5C:
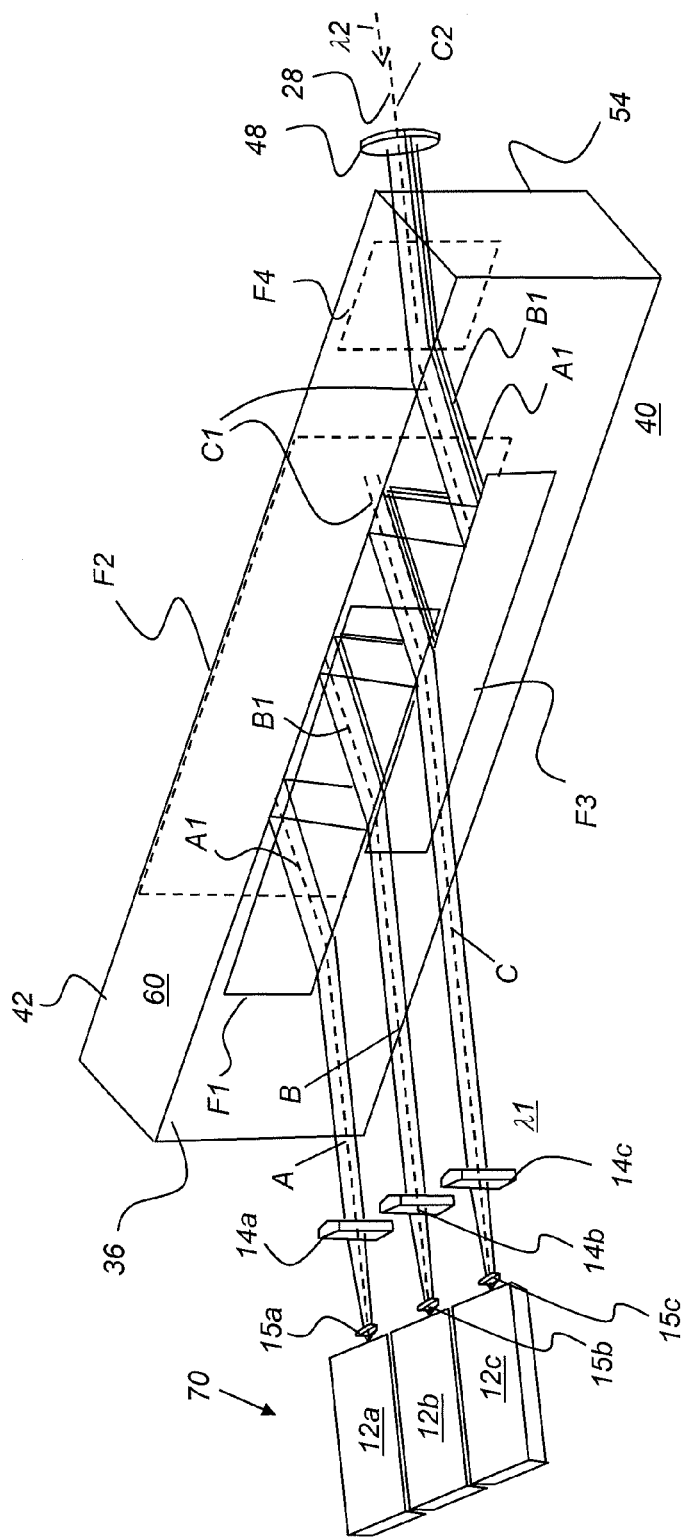
FIG. 5C is a perspective schematic view that shows an apparatus for combining light using a filter apparatus and shows light paths according to an embodiment of the present invention.
Figure 5D:
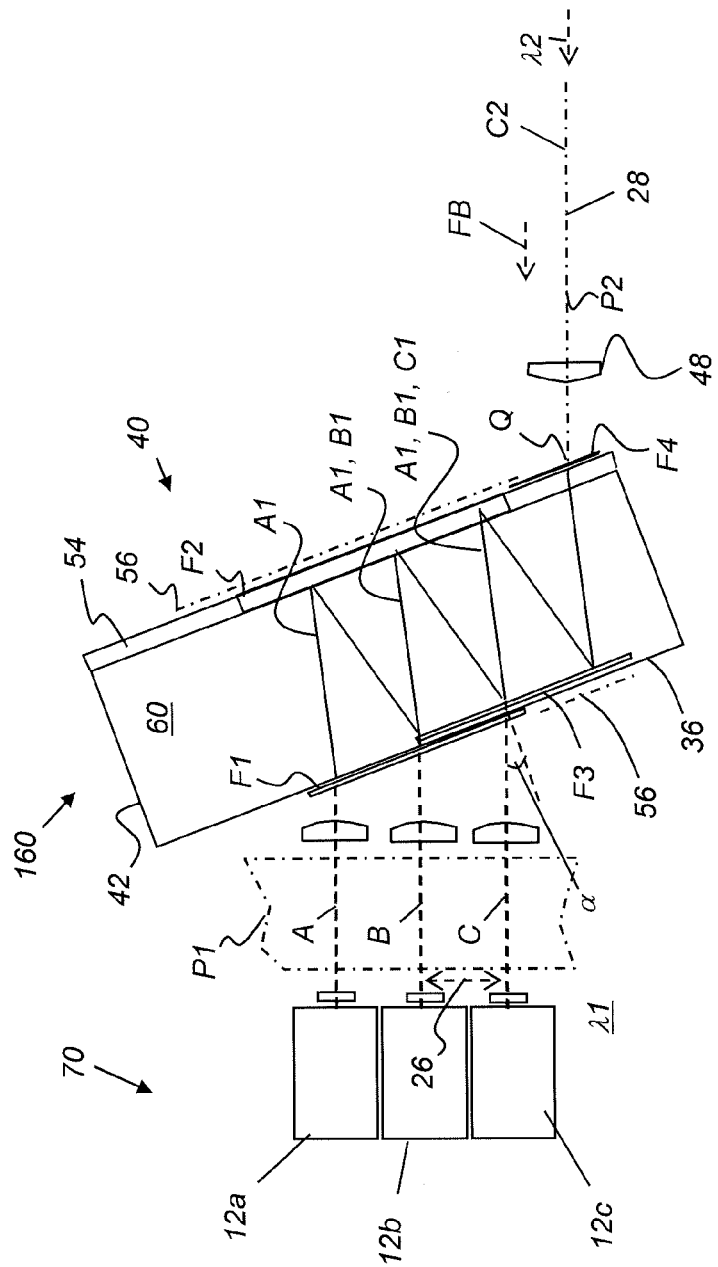
FIG. 5D is a top view of the apparatus for combining light shown in FIG. 5C.

In the top view of FIG. 5D, the axes of emitted laser beams are aligned along a first direction that defines a first plane P1 that contains axes A, B, and C (the first plane P1 being a generally horizontal plane in the view of FIG. 5C and lying in the plane of the page in FIG. 5D). Emission axes A, B, and C are equidistant from each other in plane P1, separated by an inter-axis distance 26 as shown in FIG. 5D. At the output of filter apparatus 40, the combined beams are re-aligned in a second, orthogonal direction, that is, with axes aligned along an orthogonal plane P2 (extending orthogonally outward from the page as shown in FIG. 5D and represented in FIG. 5E) and wherein the distance between axes for the filtered and combined light in plane P2 is less than inter-axis distance 26 for incident light in plane P1. The combined component beams form composite light beam 28 along a composite axis C2. The component beams are spaced apart in this direction, as was shown in inset W in the example of FIG. 1A. With respect to FIG. 5D and similar top view figures that follow, filters F1 and F3 may be shown offset from each other to allow better visibility. In embodiments of the present invention, filters F1 and F3 are preferably coplanar.

Figure 5E:
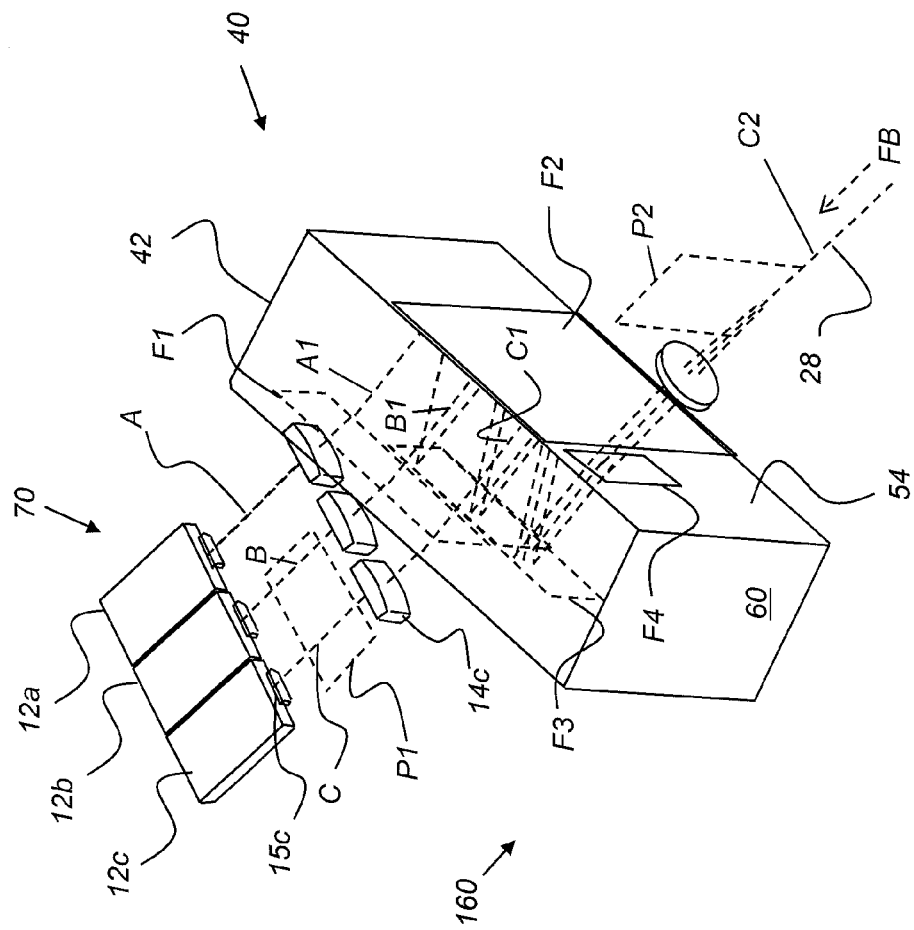
FIG. 5E is a rear view of the apparatus for combining light shown in FIG. 5C.

Thus, following the basic pattern described with reference to FIG. 5A, FIG. 5C and the top and rear views of FIGS. 5D and 5E show how the light beams in combining apparatus 60 are successively shifted within filter apparatus 40 or other type of combining apparatus 60 and directed from one reflective surface to the next. Light along axis A is refracted and travels within plate 42 or other refractive body along a redirected axis A1 toward rear long wavelength pass filter F2 formed on a rear surface 54. Light along axis A1, at the first wavelength λ1 emitted from laser 12a, reflects from long wavelength pass rear filter F2 toward long wavelength pass front filter F3. Axis A1 is then incident on front filter F3, just below the entry point of light from laser 12b, again of the first wavelength λ1, along axis B. Both rear filter F2 and front filter F3 are treated or otherwise formed to reflect light of wavelength λ1 from light sources 12a-12c back into filter apparatus 40 and to transmit light of the emitted laser wavelength λ2 from the pumped laser out from filter apparatus 40. As shown in FIG. 5C, the light along axis B is incident on plate 42 at a position just above or past an edge of long wavelength pass front filter F3. Refraction by plate 42 then redirects the incident light from axis B to a redirected axis B1 that is aligned with redirected axis A1, wherein the alignment direction for axes A1 and B1 is orthogonal to the initial alignment direction (plane P1) for axes A, B, and C.

Continuing with the light path description shown in FIGS. 5C, 5D, and 5E, light axes A1 and B1 for light of the first wavelength λ1 reflect from long wavelength pass rear filter F2 back toward front filter F3. Axes A1 and B1 now reflect from long wavelength pass front filter F3, just below the entry point of light from laser 12c along axis C. Again as shown in FIG. 5C, the light along axis C is incident on plate 42 at a position just above or past an edge of front filter F3. Refraction by plate 42 then redirects the incident light from axis C to a redirected axis C1 that is aligned with redirected axes A1 and B1, wherein the alignment direction for axes A1, B1, and C1 is orthogonal to the initial alignment direction (plane P1) for axes A, B, and C. In the three laser embodiment of FIGS. 5C, 5D, and 5E, the light of wavelength λ1 along redirected axes A1, B1, and C1 is again reflected from long wavelength pass rear filter F2 to front filter F3 and exits plate 42 through short wavelength pass filter F4, forming composite light beam 28 thereby.

Following each light path in the embodiment shown in FIGS. 5C-5E, it can be seen that each light path encounters all four filters F1-F4. The incident light from each of laser sources 12a-12c is incident once on each of short wavelength pass filters F1 and F4. The C-C1 light path from laser 12c is also incident once upon long wavelength pass rear filter F2 and once upon long wavelength pass front filter F3. The B-B1 light path from laser 12b is incident twice upon long wavelength pass rear filter F2 and twice upon long wavelength pass front filter F3. The A-A1 light path from laser 12a is incident thrice upon long wavelength pass rear filter F2 and thrice upon long wavelength pass front filter F3. It can be appreciated that with this arrangement, feedback light FB from the pumped laser can be greatly reduced and substantially eliminated from reaching the pump lasers. Thus, the arrangement of the four filters F1-F4 shown in FIG. 5A effectively provides stacked- or cascaded-filter performance for any number of lasers. As noted earlier, short wavelength pass filter F1 is optional. In an alternate embodiment, only one short wavelength pass filter is provided, which may be at the position shown for either filter F1 or filter F4 in FIGS. 5A-5E. Where short wavelength pass filter F1 is not used, an anti-reflection (AR) coating is generally provided on the corresponding surface.

Using the embodiment of FIG. 5B-5E, it is instructive to consider how the stacked-filter effect that is provided by filter apparatus 40 attenuates unwanted feedback FB light even where long wavelength pass filters F3 and F2 are of moderate quality.

Figure 6B:
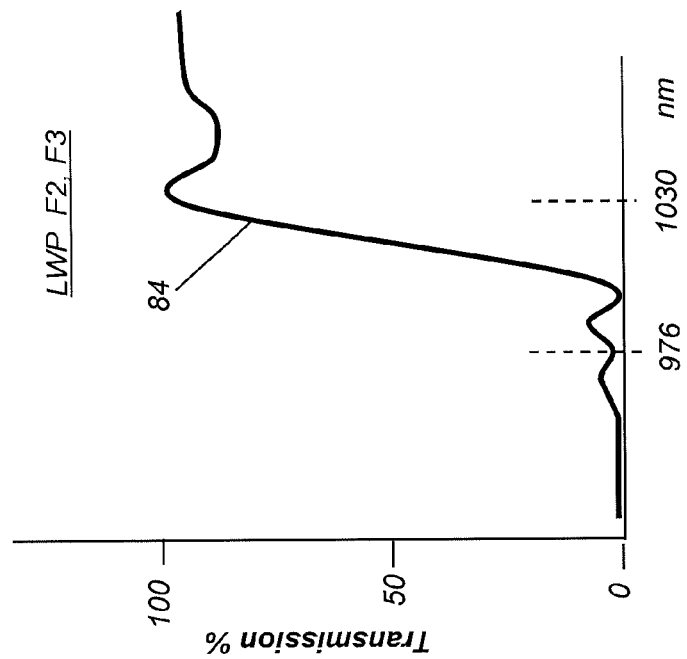
FIG. 6B is a graph showing a spectral characteristic curve for long wavelength pass filters in the filter apparatus of FIGS. 5B-2E consistent with an embodiment of the present invention.
Figure 6A:
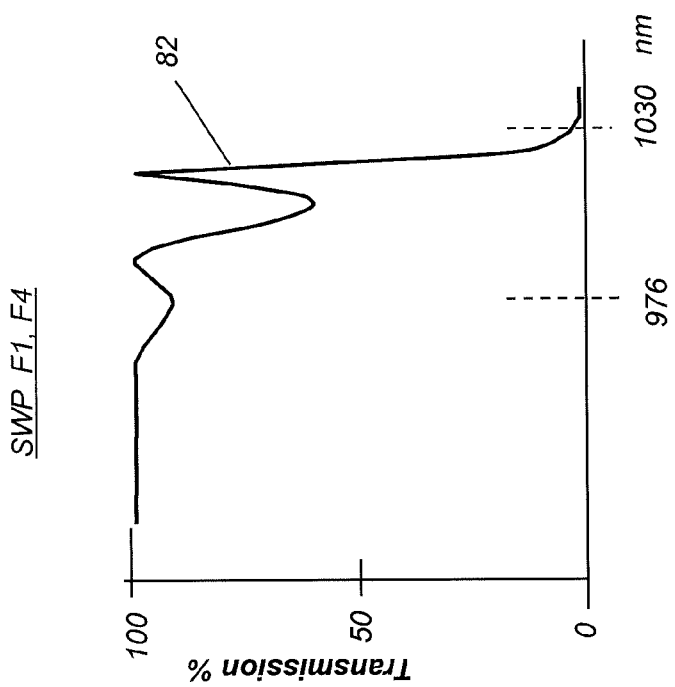
FIG. 6A is a graph showing a spectral characteristic curve for short wavelength pass filters in the filter apparatus of FIGS. 5B-5E consistent with an embodiment of the present invention.

Referring to FIG. 6A, a spectral characteristic curve 82 for short wavelength pass (SWP) filters F1 and F4 is shown, relative to transmission, consistent with an embodiment of the present invention. As curve 82 shows, there is some transmission of the unwanted 1030 nm feedback light FB. However, in an embodiment wherein there are two of these short wavelength pass filters in the light path, even if each filter allowed 3% transmission (0.03), the percentage of light of 1030 nm that would be transmitted through the two short wavelength pass filters F1 and F4 would be:

$(0.03)^2 = 0.0009$ or $0.09\%$

Referring to FIG. 6B, a spectral characteristic curve 84 for long wavelength pass (LWP) filters F2 and F3 is shown, again relative to transmission, consistent with an embodiment of the present invention. As curve 84 shows, there is still some reflection of the unwanted 1030 nm feedback light FB. However, the stacked filter effect also works to advantage here. Considering the example system of FIG. 5C, where front and rear long wavelength pass filters F3 and F2 attenuate FB light by transmitting 96% of this light, and short wavelength pass filters F1 and F4 attenuate FB light by reflecting 97% of the light, the percentage of FB light that could be received by pump laser 12c is the product:

$$(0.04)^2 (0.03)^2 = 0.00000144 \text{ or } 0.000144\%$$

The percentage of FB light that could be received by pump laser 12b is as follows:

$$(0.04)^4 (0.03)^2 = 2.304\, E{-}7 = 0.0000002394 \text{ or } 0.00002394\%$$

The percentage of FB light that could be received by pump laser 12a is as follows:

$$(0.04)^6 (0.03)^2 = 3.6864\, E{-}12 = 0.0000000000036864 \text{ or } 0.00000000036864\%$$

Thus, it can readily be seen that using filter apparatus 40 with filters F1-F4, as opposed to reflective surfaces M1 and M2 as in the FIG. 5A embodiment, can provide advantages for attenuating stray λ2 feedback light from the pumped laser, essentially reducing any feedback light FB to negligible levels, thereby helping to protect against damage to pump lasers 12a-12c. High levels of attenuation to feedback light FB are provided by stacking the filters in this arrangement, so that even when using filters with moderate individual performance, their combination provides a resulting spectral characteristic that can exceed what is feasible using a single filter.

FIG. 5D also shows positions for an optional absorber 56 that is provided, as a type of light dump component for absorbing stray feedback light FB from the pumped laser. One absorber 56 is disposed near the rear surface 54 for absorbing light transmitted through long wavelength pass rear filter F2. Another absorber 56 is shown disposed near incident surface 36, aligned with the top edge of a portion of long wavelength pass front filter F3. Absorber 56 can be formed onto the rear surface of either long wavelength pass filter F3 or F2 or may be a separately formed and disposed alongside and spaced apart from filter apparatus 40 surfaces.

Still referring to FIG. 5D, absorber 56, intended to absorb feedback light FB from the pumped laser that is inadvertently transmitted through front and rear filters F3 and F4, would receive a higher proportion of energy from the feedback light FB nearer the point of exit Q of the pump light. After repeated attenuation by long wavelength pass filters F3 and F2, only a negligible component of feedback light FB is likely to be transmitted through surfaces 36 or 54 further away from point of exit Q, for example. Thus, absorber 56 may not extend the full length of filters F3 and F2, or may be of variable thickness depending on its distance from point Q, for example.

As FIGS. 5A-5E show, light is directed toward combining apparatus 60 at oblique angles of incidence. Oblique incidence within the plane defined by at least axes A and B, plane P1 in FIG. 5D, provides refractive re-direction of light along each axis, so that light that is reflected from long wavelength pass filters F3 and F2 from a first axis aligns with incident light along the adjacent axis. The angle designated at a along axis C in FIG. 5D is shown with respect to normal to surface 36 and is between incident surface 36 and any of the incident axes A, B, and C, lying within plane P 1. In the context of the present disclosure, this incident angle α is considered to be the in-plane angle.

Figure 7:
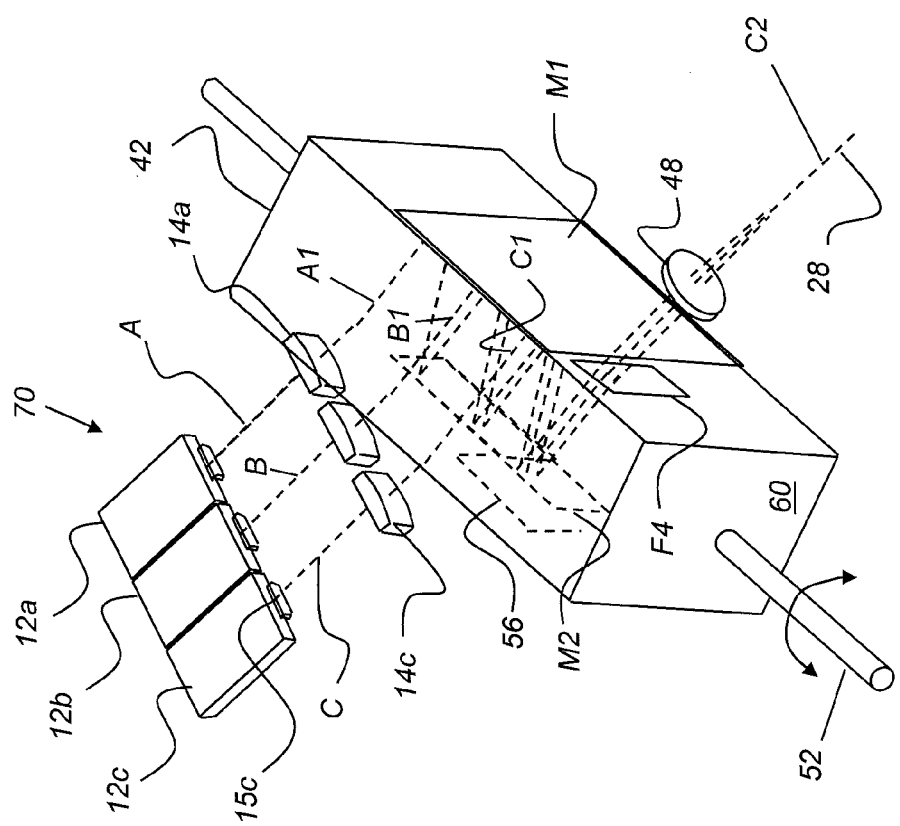
FIG. 7 is a perspective view of the apparatus for combining light using a filter apparatus, showing a tilt axis for adjusting distance between component light beams.

In addition to oblique incidence relative to incoming light in the plane P1, combining apparatus 60 also has a measure of tilt with respect to an axis that is parallel to plane P1. Advantageously, this tilt is adjustable and gives filter apparatus 40 its capability to control the aspect ratio of composite light beam 28. This adjusts the gap distance between component light beams, shown in FIG. 1A as dead space 24. The perspective view of FIG. 7 shows a tilt axis 52 for adjusting tilt. Tilt axis 52 is parallel to the plane that contains light axes A, B, and C (for example, plane P1 in FIGS. 5D and 5E). Rotation about tilt axis 52 changes the angle of incidence of incident surface 36 relative to the light along axes A, B, and C and effects corresponding changes in the angles at which light of wavelength λ1 is reflected from front and rear reflective surfaces M2 and M1 (or, alternately, reflective filters as described with reference to FIGS. 5B-5E). In one embodiment, mounting hardware provided with combining apparatus 60 allows rotational adjustment about tilt axis 52, such as during initial alignment and setup of combining apparatus 60. One or more of absorbers 56 or other components may also rotate about tilt axis 52 as filter apparatus 40 is rotated.

Figure 8A:
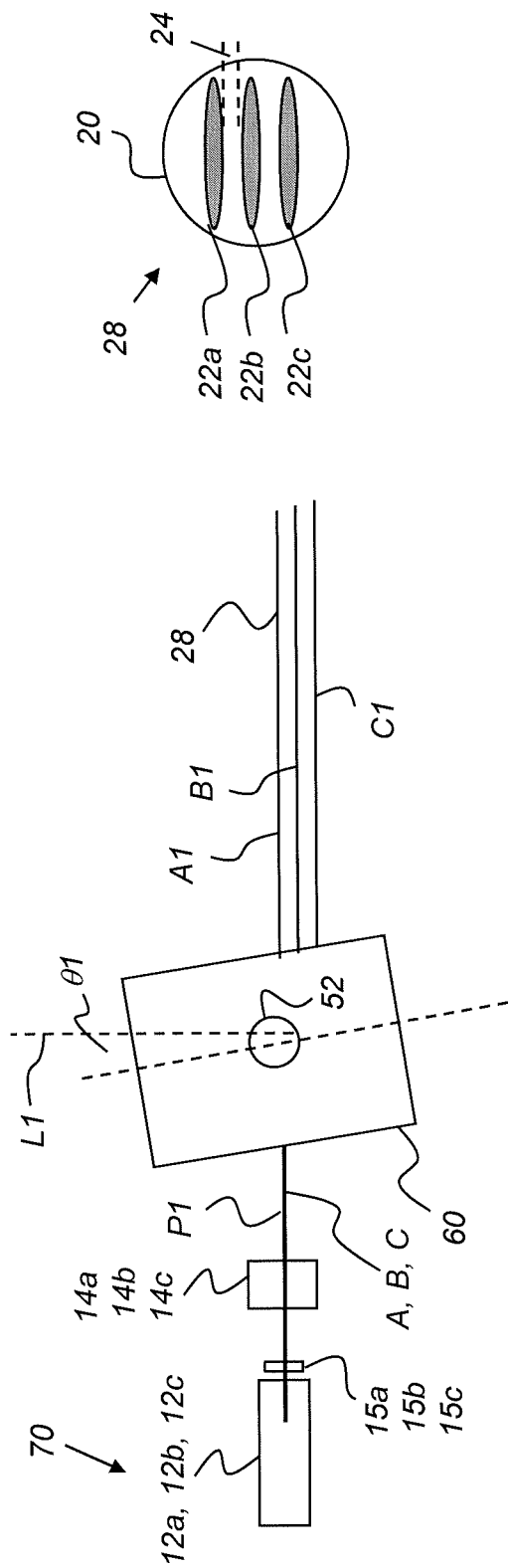
FIGS. 8A and 8B are block diagrams in cross-section that show the affect of tilt angle on the spacing and aspect ratio of the composite light beam.
Figure 8B:
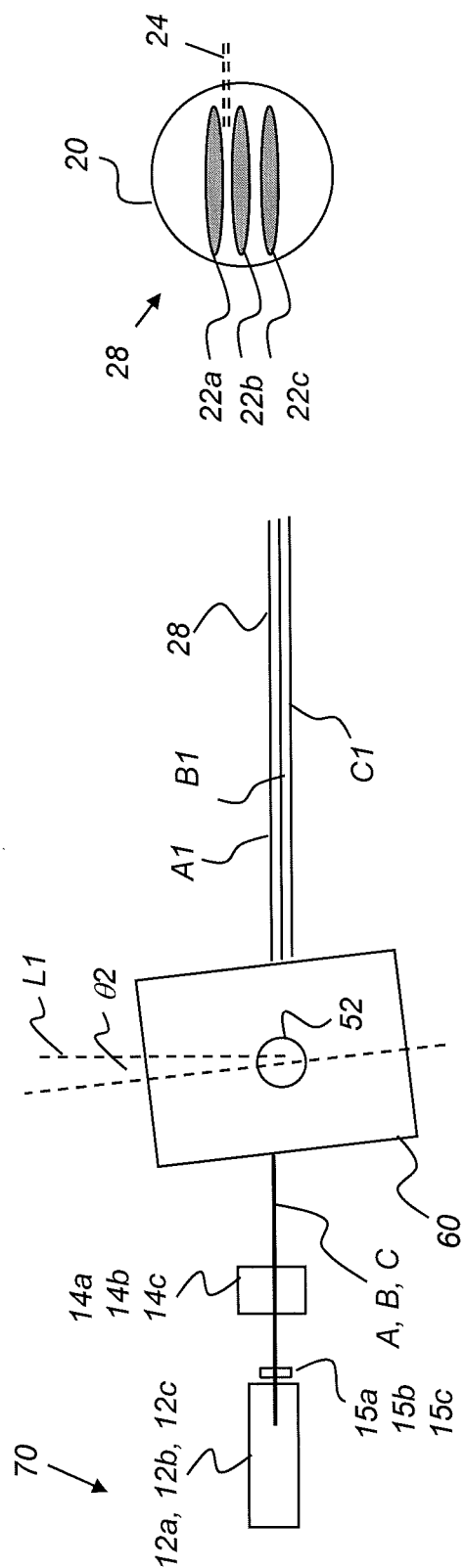

The cross-sectional views of FIGS. 8A and 8B show the effect of tilt about tilt axis 52 on component beam 28. At a first tilt angle θ1 at the top of FIG. 8A, wherein tilt angle θ1 is with respect to a normal (vertical in the FIG. 8A representation), output beams 22a, 22b, and 22c are spaced apart by the amount of dead space 24 as shown. Tilting to a smaller tilt angle θ2, as shown in FIG. 8B, decreases the amount of dead space 24 between output beams 22a, 22b, and 22c accordingly. This changes the spatial aspect ratio of beam 28, which can be expressed as the ratio of x to y or height to width, for example, of the composite light beam formed by combining apparatus 60. By way of reference, tilt angles θ1 and θ2 are with respect to a perpendicular to plane P1 of FIG. 5D, with the perpendicular shown as dotted line L1 in FIG. 8B. Plane P1 is orthogonal to the page and along the A, B, C axes in the cross-sectional view of FIGS. 8A and 8B.

Figure 9B:
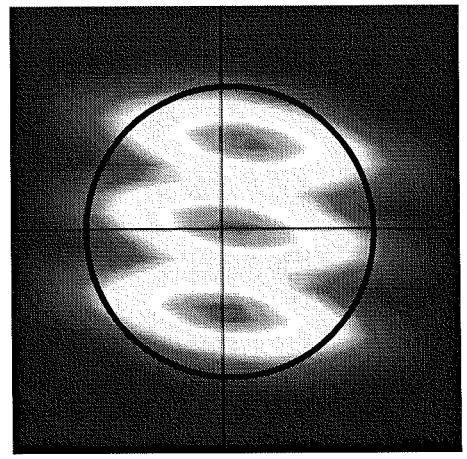
FIGS. 9A and 9B are cross-sectional views of the profile of the composite output beam in the fiber lens pupil with a combining apparatus at two alternate tilt angles.
Figure 9A:
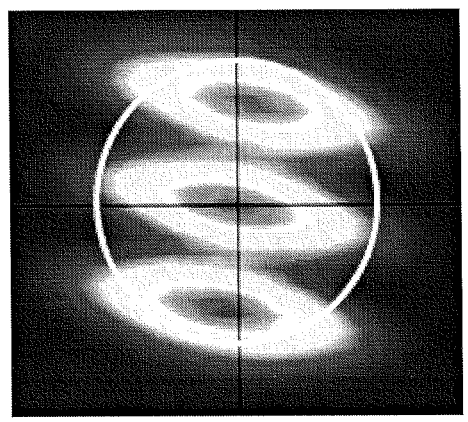

As shown in FIGS. 8A and 8B, the capability to adjust the spatial aspect ratio along one axis with a single tilt adjustment is advantaged for shaping composite light beam 28 for input to optical fiber 20 or other optical device. By way of example, FIGS. 9A and 9B show angular distributions of energy intensity from a three-laser apparatus using combining apparatus 60 at two different tilt angles. As FIG. 9B shows, the use of a smaller tilt angle θ compresses or eliminates the dead space between component output beams. By way of comparison, a circle in each of FIGS. 9A and 9B indicates the approximate numerical aperture (N.A.) of an optical fiber.

Figure 10:
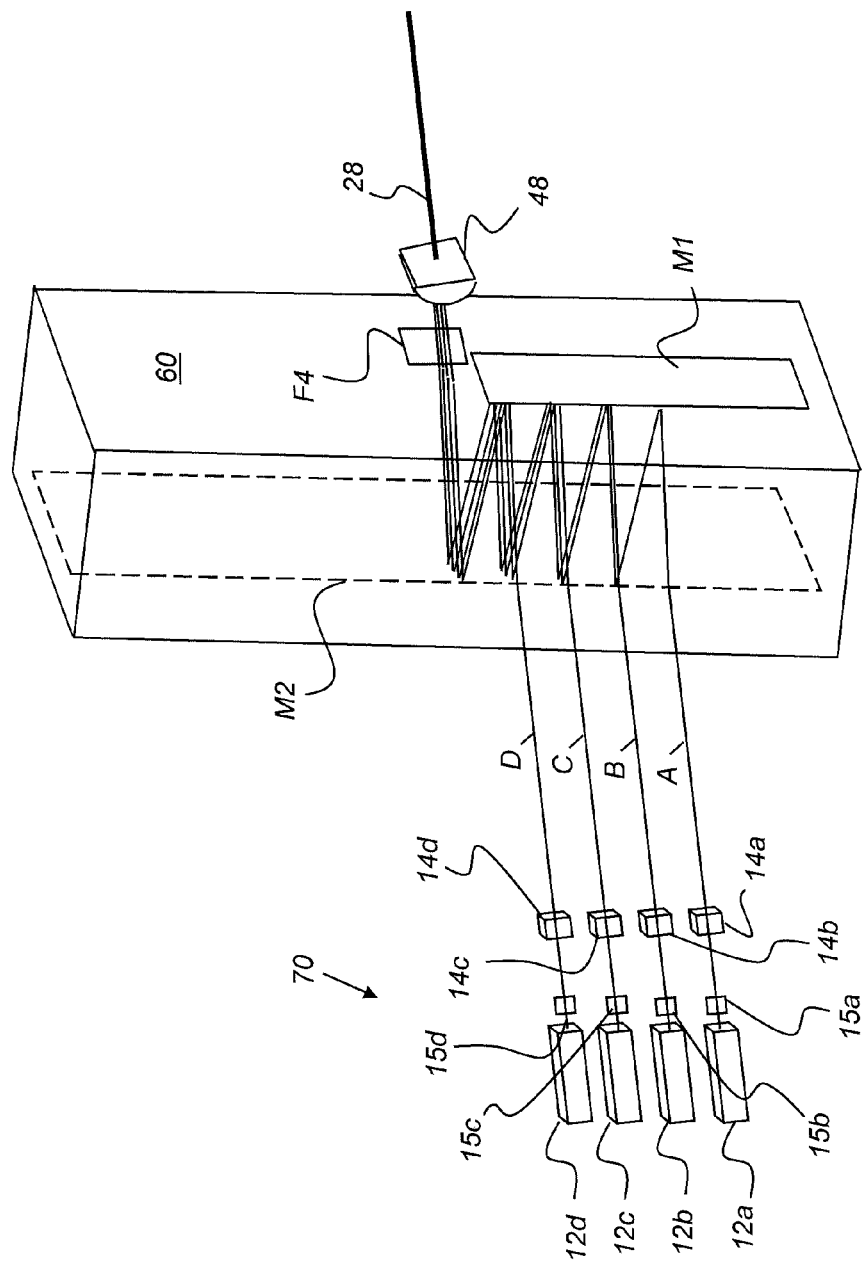
FIG. 10 is a perspective view showing an alternate embodiment in which a combining apparatus has more than three laser light sources.
Figure 11:
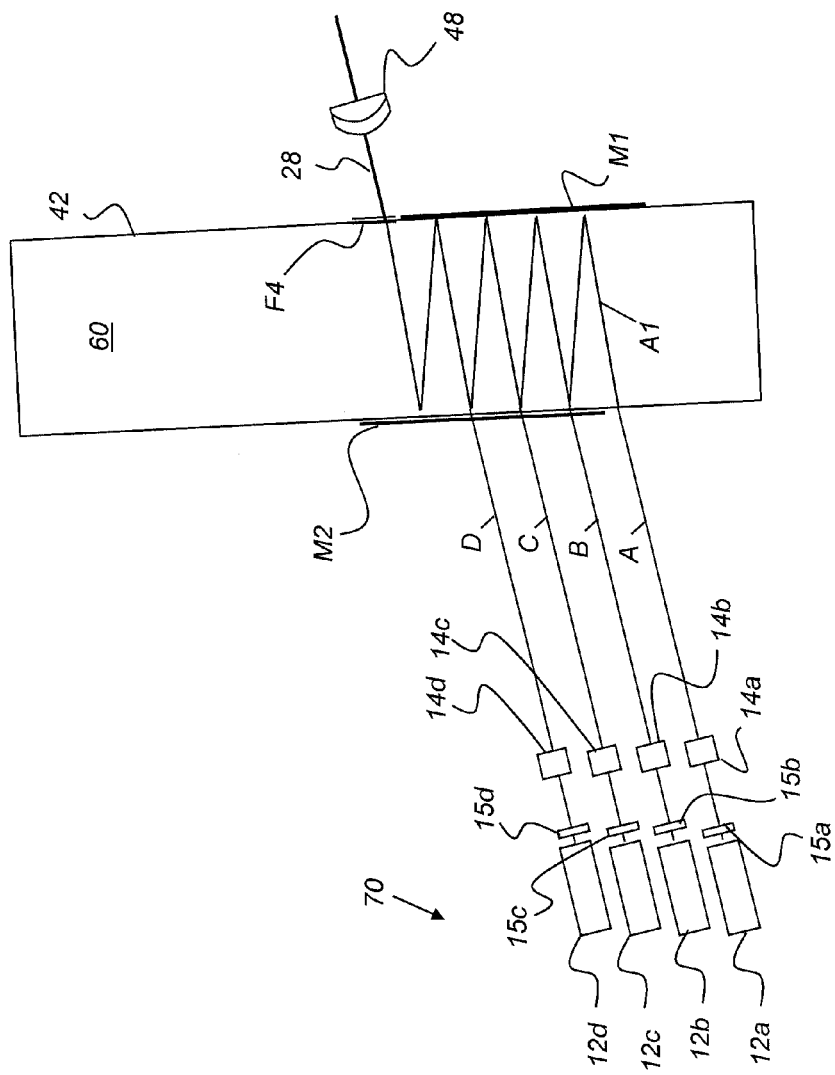
FIG. 11 is a top view showing light paths in the alternate embodiment of FIG. 10.

A further advantage when using combining apparatus 60 relates to the capability to use more than 3 lasers, as is the current limitation with conventional devices such as that described previously with respect to FIGS. 1A and 1B. Referring to the perspective view of FIG. 10 and the side view of FIG. 11, combining apparatus 60 has four lasers 12a, 12b, 12c, and 12d in pump laser array 70. Each laser 12a, 12b, 12c, and 12d has its corresponding cylindrical lens pair, with lenses 15a, 14a, 15b, 14b, 15c, 14c, and 15d, 14d as described previously. As visually represented from this alternate angle, the light axes A, B, C, and D are aligned vertically at the input surface of combining apparatus 60 and re-aligned horizontally in composite light beam 28. Optional absorbers 56, not shown in the view of FIG. 10 for clarity, may also be provided in this embodiment. In addition, filter apparatus 40 could be used as combining apparatus 60 in any of the embodiments of FIGS. 10-14.

Figure 12:
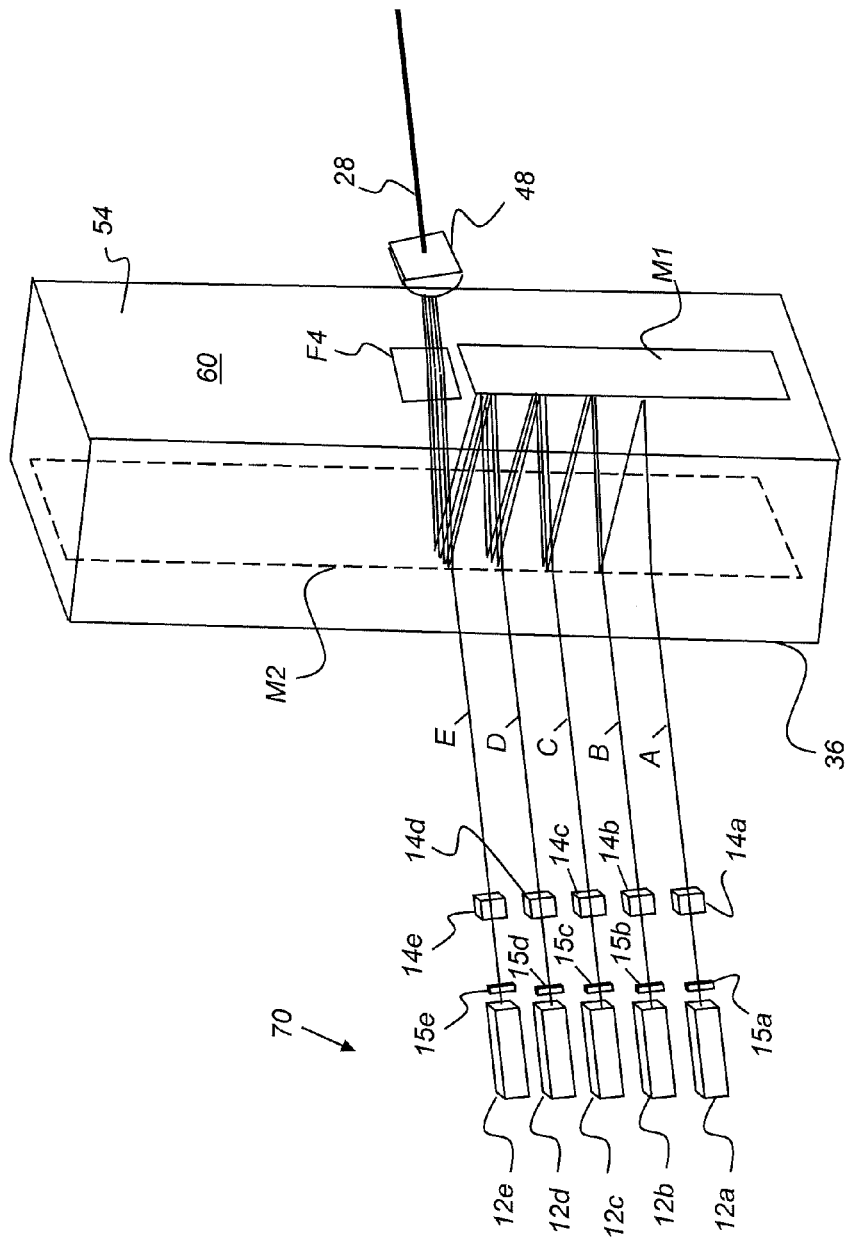
FIG. 12 is a perspective view showing an alternate embodiment in which a combining apparatus has five laser light sources.
Figure 13:
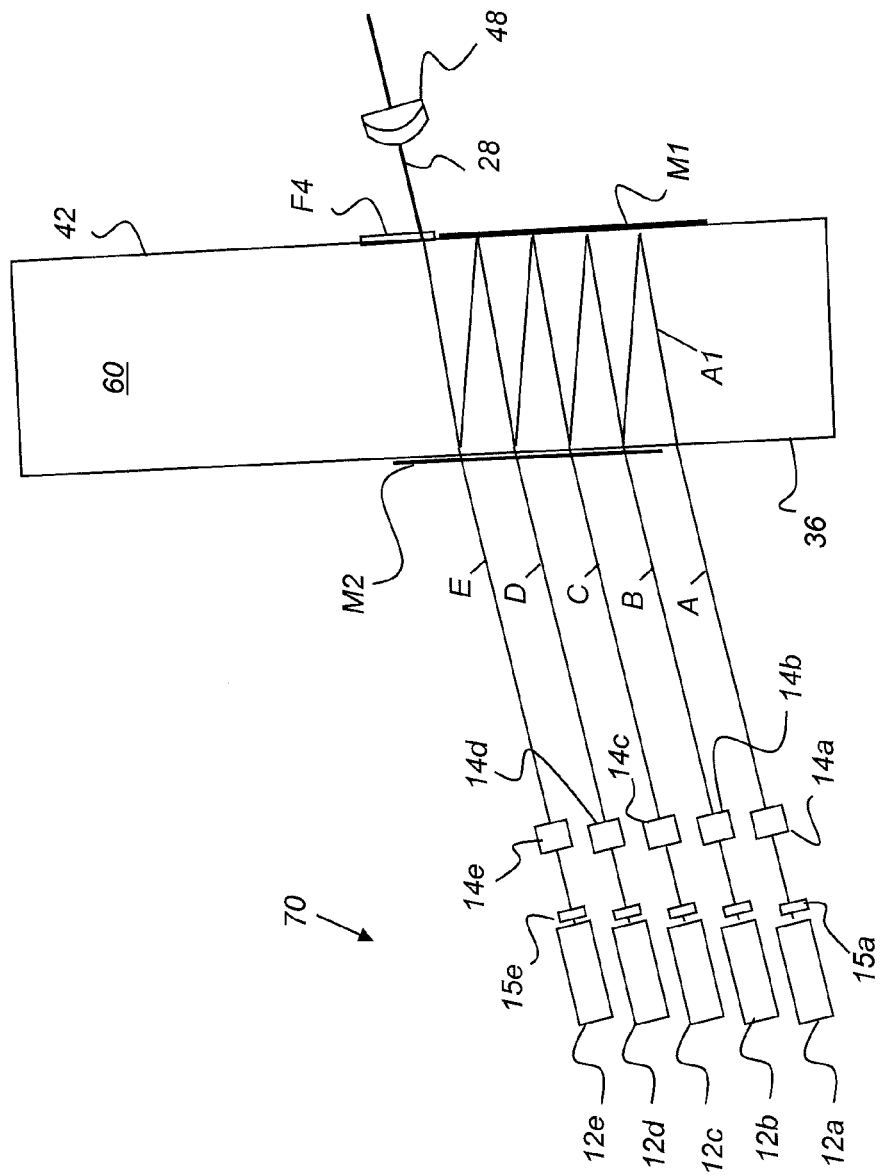
FIG. 13 is a top view showing light paths in the alternate embodiment of FIG. 12.

It can be appreciated that additional lasers, in excess of 4, could be added using combining apparatus 60 with filters F1-F4, with appropriate dimensioning of front and rear long wavelength pass filters F3 and F2 or alternatively, with reference to FIG. 5A, by appropriate dimensioning of reflective surfaces M1 and M2. FIGS. 12 and 13 show perspective and side views, respectively, of combining apparatus 60 having five lasers 12a, 12b, 12c, 12d, and 12e in pump laser array 70. As described previously, each laser 12a, 12b, 12c, 12d, and 12e has a corresponding cylindrical lens pair and directs light along its corresponding axis A, B, C, D, or E.

Figure 14:
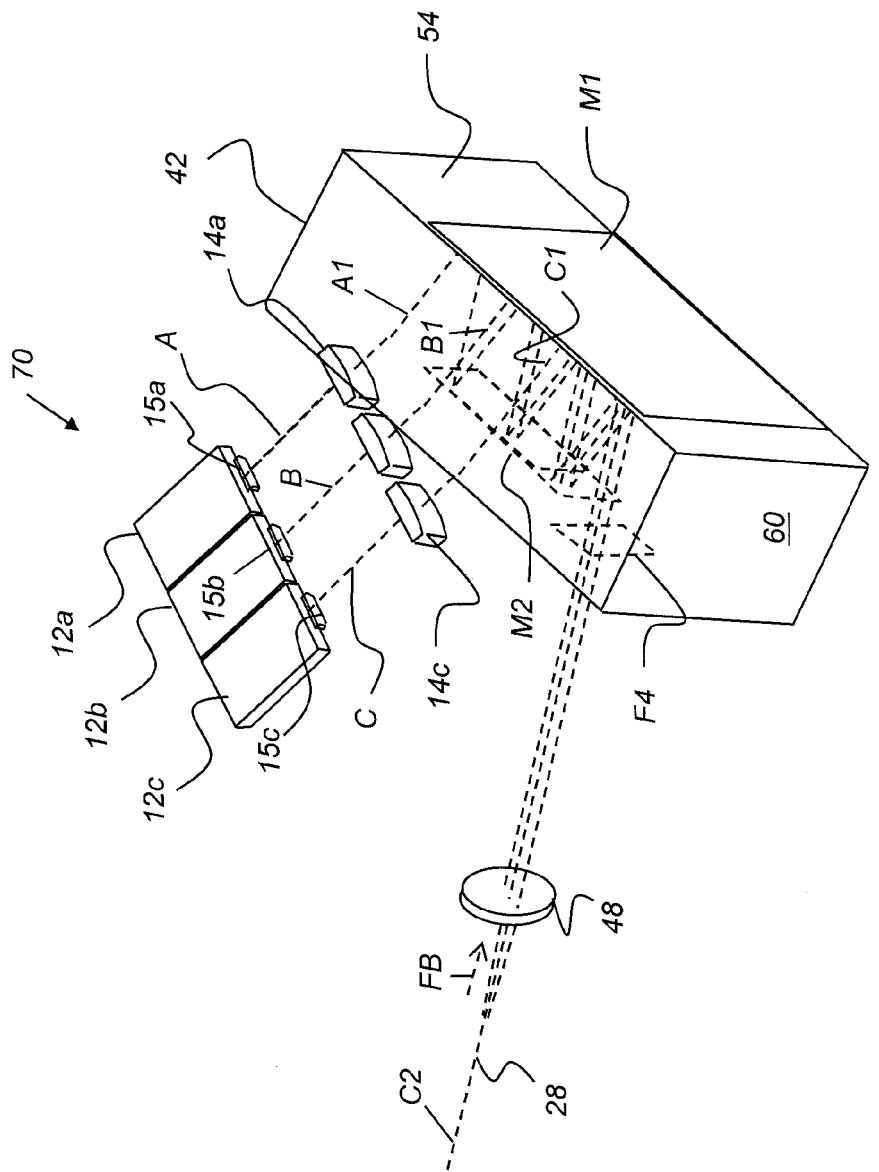
FIG. 14 is a perspective view that shows an alternate embodiment of a combining apparatus having a reflected output beam.

The perspective view of FIG. 14 shows an alternate embodiment, in which the output composite light beam 28 is reflected from rear reflective surface M1. In this embodiment, rear surface 54 can be partially or fully coated as reflective surface M1. This embodiment may have advantages for packaging and light path folding. However, this embodiment would not allow tilt adjustment of the beam spacing of composite light beam 28 without also changing the angle of output composite axis C2 (with respect to vertical plane P2).

Figure 15:
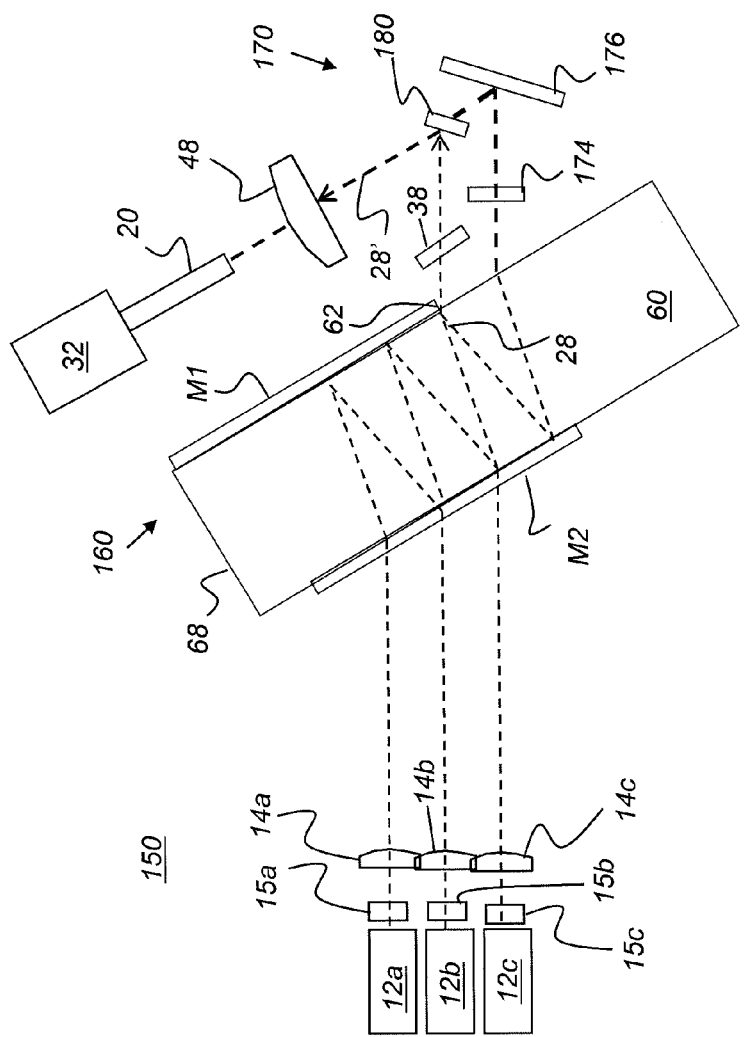
FIG. 15 is a top view of an apparatus for providing laser light from three laser sources to an optical fiber consistent with an embodiment of the present invention.

One advantage of combining apparatus 60 using the basic model of FIG. 5A and the embodiments shown in FIGS. 5B-5E, and FIGS. 10-14 relates to the use of an edge of reflective surface M1 (FIG. 5A) or, alternately, an edge of filter F2, to bisect or split composite beam 28 and to redirect a portion of composite beam 28 to a separate beam path, so that one of the two beam paths goes through polarization light combining apparatus 170. The schematic diagrams of FIGS. 15, 16, 17, and 18 show how this accomplishes separation of the two portions of composite beam 28 without requiring an additional bisecting reflective element external to the structure of combining apparatus 60. FIG. 15 shows the position of an edge 62 of reflective surface M1 for splitting or bisecting composite beam 28.

Figure 16:
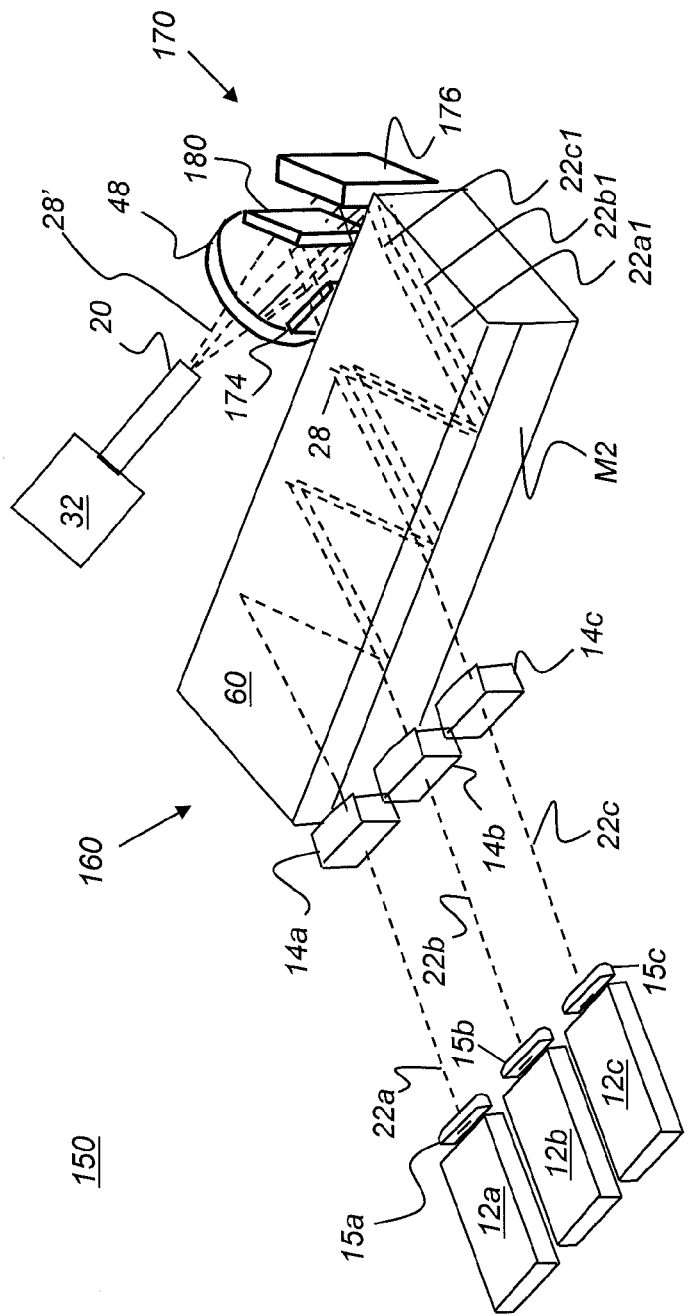
FIG. 16 is a front perspective view of the apparatus of FIG. 15.
Figure 17:
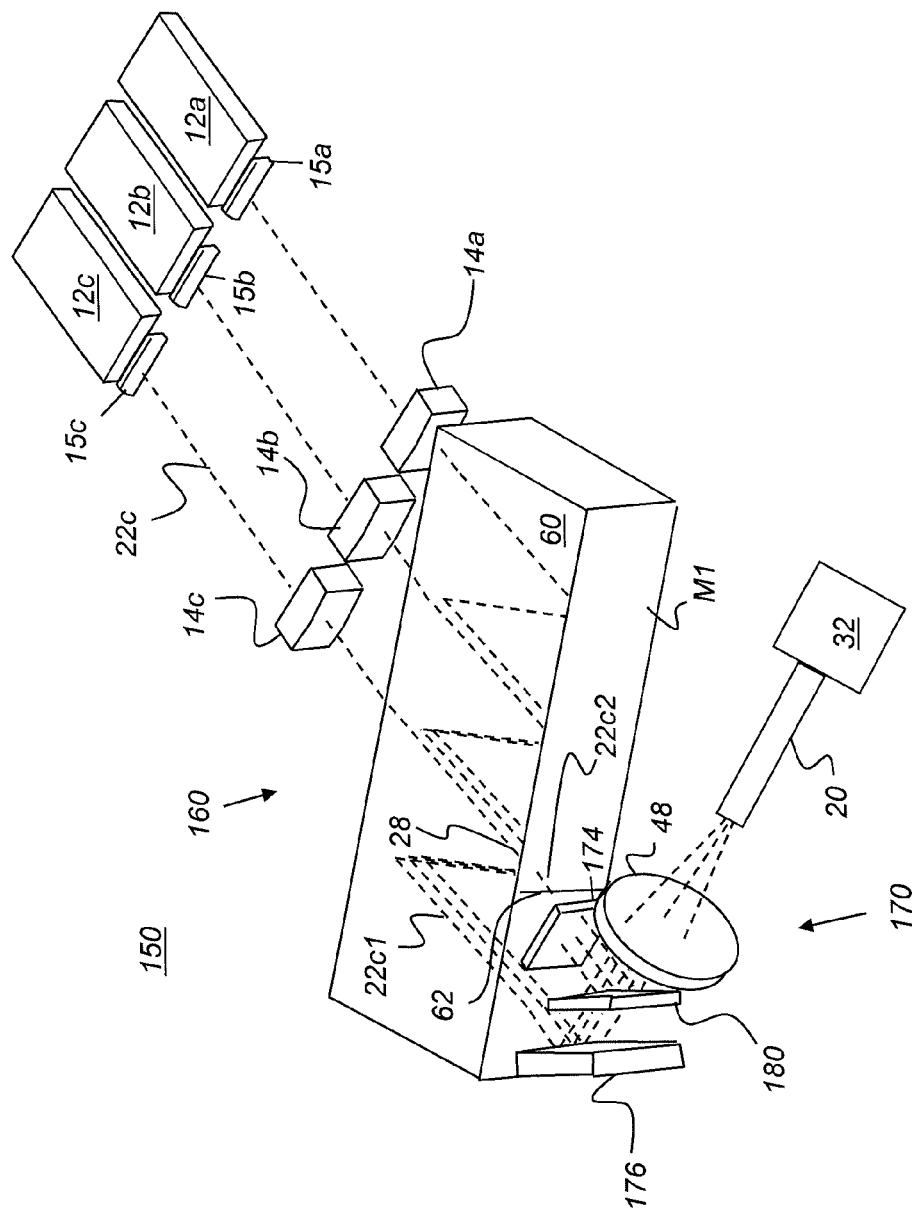
FIG. 17 is a rear perspective view of the apparatus of FIG. 15.
Figure 18:
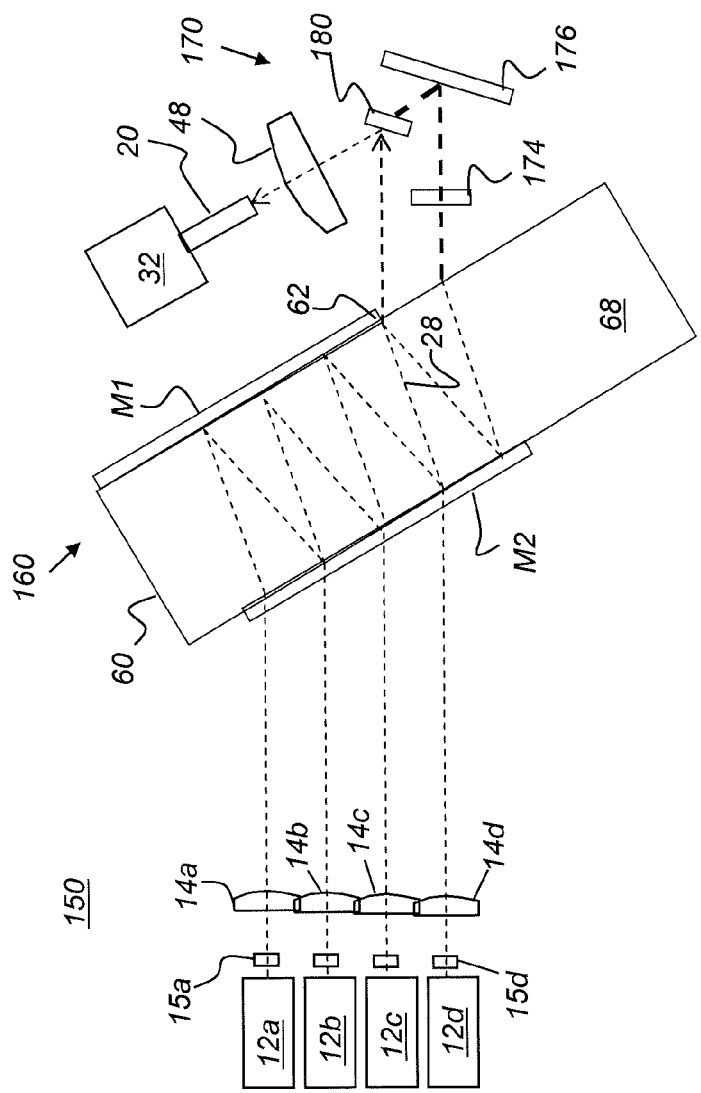
FIG. 18 is a top view of an apparatus for providing laser light from four laser sources to an optical fiber consistent with an embodiment of the present invention.

The schematic diagrams of FIGS. 15, 16, and 17 show top, front, and rear perspective views, respectively, of an optical apparatus 150 formed when combining apparatus 60, as described with reference to FIGS. 5A-5E, is used as spatial light combining apparatus 160 and is coupled with polarization light combining apparatus 170. FIGS. 15, 16, and 17 show an embodiment with three lasers 12a, 12b, and 12c providing pump light to a pumped laser 32 that is coupled to optical fiber 20. Reflective surfaces M1 and M2 could be replaced with one or more filter surfaces F2 and F3, as described previously. Composite light beam 28 is formed so that it is internal to combining apparatus 60 in this embodiment. The re-configured composite light beam 28' is formed following polarization light combining apparatus 170, as described previously. Here, only a single folding reflective element 176 is needed for light path redirection, external to combining apparatus 60. By way of reference and using the notation given in FIG. 4B, FIG. 16 shows the redirected portion of beam 28, shown as portions 22a1, 22b1, and 22c1, directed to reflective element 176 and transmitted through a polarized light combiner, polarization beam splitter 180. The other portion of beam 28 goes through one or more wave plates or other polarization rotator 174 and is reflected from polarization beam splitter 180. By way of illustration, following the path of light from laser 12c, FIG. 17 shows the paths of beam portions 22c1 and 22c2 formed by splitting output beam 22c along edge 62. FIG. 15 also shows the use of optional tilted plate 38 in one of the optical paths; various arrangements using one or more tilted plates 38 in either optical path can be used for beam adjustment. FIG. 18 shows a similar arrangement to that of FIGS. 15-17, with four laser sources.

Referring back to FIG. 3A, it can be seen that embodiments of optical apparatus 150 now make it possible to use a laser diode light source having an optical invariant (etendue) that exceeds the optical invariant of the optical fiber along one axis. In FIG. 3A, the optical invariant of the light source that generates output beam 22b', for example, exceeds the optical invariant of the optical fiber. This is represented as exceeding the invariant of input aperture 90, in the slow axis (SA) dimension. Embodiments of the present invention allow this relationship and use the light that would otherwise be excessive with conventional approaches. This allows laser diodes, such as those used for lasers 12a, 12b, 12c in FIG. 15, for example, to be fabricated in longer sections, thereby increasing the efficiency and reducing the cost of laser light generation. Previously, for example, laser diodes of up to about 100 um length were used for pump lasers 12a, 12b, 12c. Lasers of added length in excess of 100 um were impractical because they exceeded the etendue of the optical fiber in the SA direction. By bisecting the light beam in the SA direction, embodiments of the present invention allow the use of lasers of additional length, making it practical to fabricate laser diodes providing output light of greater than 100 um length.

Optical apparatus 150 of embodiments of the present invention provides a number of features and advantages over conventional solutions for combining multiple laser sources to form a single composite light beam. These advantages include:

(i) Positioning of lasers along the same plane and directed in parallel, allowing the use of a laser array and simplifying laser alignment from the stepped-height requirements for earlier laser diode combining apparatus arrangements, such as those described with reference to FIG. 1B.

(ii) Use of a low-cost transparent plate, such as a glass plate with filter coatings. The use of thin-film coatings allows a very sharp edge to be presented to incoming light beams, reducing scatter and other effects.

(iii) Adjustable aspect ratio in both fast axis and slow axis directions, as described earlier with respect to FIGS. 3A through 4B and 8A through 9B. This allows improved etendue matching with existing laser diode designs as well as efficient use of laser diodes that have even more pronounced asymmetry of the aspect ratio of the etendue of the output beam.

(iv) Scalable, with a variable number of lasers, from one or more lasers, including embodiments using 4 or more lasers as described with reference to FIGS. 10-13 and 18.

(v) Improved thermal stability, since all pump lasers direct light through the same filter components.

(vi) Optional built-in protection from interfering wavelengths of light, particularly from leakage light emitted from the pumped laser.

(vii) Simplified fabrication and alignment.

(viii) Improved component life. This applies both to the pump lasers themselves and to reflective surfaces M1, M2 or alternately, filter surfaces F1, F2, F3, and F4, over conventional single-filter or stacked-filter arrangements. Thin-film reflectors and filters, for example, are advantaged over other reflector or filter types for having high damage thresholds from laser light.

The addition of polarization light combining apparatus 170 to spatial light combining apparatus, including the retrofit arrangement with existing light combining modules such as pump module 10 of FIG. 1A, allows the use of one or more laser diodes having lengths that exceed those currently in use for laser pumping. Alignment requirements are also relaxed. Because of this, embodiments of the present invention provide a solution for laser pumping that is more efficient and less costly than with existing approaches, even allowing the more efficient use of a single solid-state laser that is fabricated to have a longer length for light emission.

Fabrication

Transparent plate 42 of combining apparatus 60, including filter apparatus 40 embodiments, is typically a glass plate, selected for suitability with the intended laser wavelengths. Other transparent materials can be used, including crystalline materials and plastics, for example. Conventional mounting techniques can be used to position combining apparatus 60 at a suitable oblique in-plane angle α with respect to the emitted laser beams, as was described earlier with reference to FIG. 5D. In-plane angle α is determined by the index of refraction n of the selected glass or other transparent block of material used for transparent plate 42 or other transparent body.

Front and rear long wavelength pass filters F3 and F2 are formed or otherwise treated to reflect light of a first, shorter wavelength λ1, here, the pump light wavelength, and to transmit light of a second longer wavelength λ2, here, the pumped laser wavelength. Filters F3 and F2 can be formed from dichroic thin film coatings in one embodiment, advantageously providing a very thin surface with high filter selectivity, reflectivity, and transmission characteristics. The design of thin film dichroic coatings for providing a given spectral characteristic is known to those skilled in the thin film design arts and typically involves beginning with an approximate design and iteratively proceeding through a series of optimizations until the desired spectral characteristic is achieved. Reflective surfaces M1 and M2 can also be provided using thin film coatings or other types of coatings. Thin film coatings are advantaged for beam bisection or splitting, reducing diffraction and other unwanted effects over other reflective device solutions. In the embodiments shown in FIGS. 4A and 4B and FIGS. 15-18, the reflective thin film coating that bisects the beam is at an oblique angle with respect to the optical axis OA of the emitted beam.

An adjustable mechanism can be provided to allow adjustment of tilt angle, described as tilt angles θ1 and θ2 in FIGS. 8A and 8B. The adjustment can be manually performed or provided using a motor or other automated device. A lockdown apparatus can be provided for securing a completed tilt adjustment.

Combining apparatus 60 combines two or more laser beams to be directed along a single output axis as described hereinabove, and is particularly well suited for combining pump laser light from laser diodes, for which the emitted light beam is elongated in a direction along one axis, allowing these beams to be stacked together to form a composite light beam of variable aspect ratio. Embodiments of the present invention given hereinabove describe the use of combining apparatus 60 for combining beams that are generated simultaneously. As is readily apparent to one skilled in the optical arts, the combining action of combining apparatus 60 can alternately be used to direct light from any non-empty proper subset of a set that has a plurality of lasers that have emission axes lying along the same plane. Thus, for example, it may be useful to use a single pump laser for transmission at one power level, and two lasers for pump light transmission at a higher power level. Alternately, lasers of different wavelengths could be selected for transmission along composite beam axis C2.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. The invention is defined by the claims.

Thus, what is provided is an apparatus and method for combining laser light, particularly well suited for use with a laser pump source and other combining applications using solid-state laser sources, allowing adjustment of the aspect ratio of the composite light beam along either or both orthogonal axes.

The invention claimed is:

1. An apparatus for providing a light beam comprising:
a solid-state laser that is energizable to emit, along an optical axis, a polarized input laser light beam that has a first aspect ratio of etendue $R_1$, wherein the optical invariant of the input laser light beam with respect to a first direction is less than half the optical invariant of the input laser light beam with respect to a second direction that is orthogonal to the first direction;
a first cylindrical lens that is disposed to collimate the polarized input laser light beam with respect to the first direction;
a second cylindrical lens that is disposed to collimate the polarized input laser light beam with respect to the second direction;
a bisecting reflective surface having an edge that is disposed along the optical axis to split the collimated polarized laser light beam, with respect to the second direction, into a first portion directed along a first beam path and a second portion directed along a second beam path, wherein the first and second beam paths each contain emitted light from the solid-state laser;
one or more folding reflective surfaces disposed along the first beam path, along the second beam path, or along both first and second beam paths;
a polarization rotator disposed to rotate polarization of the light along the second beam path; and
a polarization combiner disposed to combine light from the first and second beam paths to form an output beam, wherein the output beam has a second aspect ratio of etendue $R_2$ that is not equal to $R_1$.

2. The apparatus of claim 1 wherein the bisecting reflective surface is formed as a thin film coating and wherein the edge of the bisecting reflective surface is at an oblique angle to the optical axis.

3. The apparatus of claim 1 wherein the optical invariant of the input laser light beam with respect to the first direction is less than one tenth of the optical invariant of the input laser light beam with respect to the second direction.

4. An apparatus for providing light to an optical fiber, the apparatus comprising:
at least first and second lasers, wherein the first laser is energizable to direct a first polarized light beam along a first emission axis and the second laser is energizable to direct a second polarized light beam along a second emission axis that is parallel to the first emission axis, wherein the first and second emission axes are aligned and spaced apart with respect to a first direction;
a light combining apparatus disposed to accept light along at least the first and second emission axes and to realign the respective emission axes of the first and second light beams with respect to a second direction that is substantially orthogonal to the first direction,
wherein the light combining apparatus is disposed to direct a first portion of the realigned first light beam and a first portion of the realigned second light beam toward a first surface of a polarization beam splitter and onto an output axis;
one or more reflective elements that are disposed to redirect a second portion of the realigned first light beam and a second portion of the realigned second light beam toward a second surface of the polarization beam splitter and onto the output axis;

a polarization rotator that is disposed between the light combining apparatus and the polarization beam splitter and is either in the path of the first portions of each of the first and second light beams or in the path of the second portions of each of the first and second light beams; and one or more lens elements disposed to direct light from the output axis toward the optical fiber.

5. The apparatus of claim 4 wherein the light combining apparatus is formed on a solid transparent body and wherein a coating on a surface of the transparent body is disposed to split the first and second light beams into the first and second portions.

6. The apparatus of claim 4 wherein the light combining apparatus comprises a solid transparent body having a first surface with a first reflective coating and a second surface, opposite to and parallel with the first surface, wherein the second surface has a second reflective coating.

7. The apparatus of claim 6 wherein at least the first surface is oblique to the first and second emission axes.

8. The apparatus of claim 6 wherein at least one of the first and second reflective coatings is a thin-film filter.

9. The apparatus of claim 4 wherein the optical invariant of at least the first laser with respect to the first direction exceeds the optical invariant of the optical fiber.

10. The apparatus of claim 4 further comprising at least one filter that reflects light of a first wavelength $\lambda 1$ emitted by the at least first and second lasers and transmits light of a higher wavelength $\lambda 2$ that is generated by a pumped laser that is coupled to the optical fiber.

11. The apparatus of claim 4 wherein the light combining apparatus further has a tilt axis that is parallel to the first direction and wherein rotation of the light combining apparatus about the tilt axis adjusts a gap distance in the second direction between the realigned first and second light beams.

12. The apparatus of claim 4 further comprising a third laser that is energizable to direct light along a third axis parallel to the first axis.

13. The apparatus of claim 4 wherein the at least first and second lasers emit polarized light of the same wavelength.

14. The apparatus of claim 4 wherein the optical fiber directs the light to a pumped laser.

15. The apparatus of claim 4 wherein at least the first laser is a solid-state laser.

16. The apparatus of claim 4 further comprising at least one tilted plate in the path of the first portions of each of the first and second light beams or in the path of the second portions of each of the first and second light beams.

17. An apparatus for providing light to an optical fiber, the apparatus comprising:
at least first and second solid-state lasers, wherein the first laser is energizable to direct a first polarized light beam along a first axis and the second laser is energizable to direct a second polarized light beam along a second axis that is parallel to the first axis and spaced apart from the first axis by a first distance, a spatial light combining apparatus that realigns the first and second axes to be spaced apart by a second distance that is less than the first distance and wherein the second distance is measured in a direction that is substantially orthogonal to the first distance;
a polarization combining apparatus that splits the realigned first light beam from the first solid-state laser into a first portion and a second portion and that splits the realigned second light beam from the second solid-state laser into a third portion and a fourth portion and redirects the first and third portions toward a first surface of a polarization beam splitter and the second and fourth portions through a polarization rotator and toward a second surface of the polarization beam splitter;
and
one or more lens elements disposed to direct light received from the polarization beam splitter toward the optical fiber.

18. The apparatus of claim 17 wherein the optical invariant of at least the first laser, in the direction of the first distance, exceeds the optical invariant of the optical fiber.

19. An apparatus for providing light to an optical fiber, the apparatus comprising:
at least a first laser that is energizable to direct a first light beam along a first axis and a second laser that is energizable to direct a second light beam along a second axis parallel to the first axis,
wherein the first and second axes define a first plane P1;
a light combining apparatus disposed to accept light along at least the first and second axes and to form a composite beam wherein the first light beam is directed along a third axis and the second light beam is directed along a fourth axis and wherein the third and fourth axes define a second plane P2 that is substantially orthogonal to the first plane P1 and wherein the light combining apparatus is further disposed to direct a first portion of the first light beam from the third axis and a first portion of the second light beam from the fourth axis toward a first surface of a polarization beam splitter and onto an output axis;
one or more reflective elements disposed to redirect a second portion of the first light beam from the third axis and a second portion of the second light beam from the fourth axis toward a second surface of the polarization beam splitter and onto the output axis, wherein the second surface of the polarization beam splitter is opposite the first surface of the polarization beam splitter;
a polarization rotator that is disposed in the path of either the directed first portions of the first and second light beams from the third and fourth axes or the redirected second portions of the first and second light beams from the third and fourth axes;
and
one or more lens elements disposed to direct light from the output axis toward the optical fiber.

20. The apparatus of claim 19 wherein the light combining apparatus further has a tilt axis that is parallel to the first plane P1 and wherein rotation about the tilt axis adjusts a distance in the second plane P2 between the third and fourth axes.

21. An apparatus for providing a pump light of a first wavelength $\lambda 1$ to a pumped laser that emits a second wavelength $\lambda 2$, comprising:
a first laser of the first wavelength $\lambda 1$ that is energizable to direct light along a first emission axis in a first direction;
a second laser of the first wavelength $\lambda 1$ that is energizable to direct light along a second emission axis parallel to the first emission axis,
wherein the first and second emission axes define a first plane P1;
a combining apparatus that is disposed to form a composite light beam of the first wavelength $\lambda 1$, the combining apparatus formed on a solid transparent body that is disposed in the path of the directed light and having:
(i) a first short wavelength pass filter that is formed on a first surface of the combining apparatus that is disposed at an oblique angle to the first and second emission axes and that is transmissive to $\lambda 1$ and reflects $\lambda 2$;
(ii) a first long wavelength pass filter formed on a second surface of the combining apparatus that is parallel to the first surface, wherein the first long wavelength pass filter reflects λ1 and transmits λ2;
  (iii) a second long wavelength pass filter that is formed on the first surface of the combining apparatus and wherein the second long wavelength pass filter reflects λ1 and transmits λ2;
  wherein the combining apparatus re-aligns the first and second emission axes along a second plane P2 that is orthogonal to P1 and parallel to the first direction;
a polarization light combining apparatus that is disposed in the path of the composite light beam, the polarization light combining apparatus comprising:
  a polarization beam splitter having a first surface disposed in the path of a first portion of the composite beam and treated to direct the first portion of the composite beam onto an output axis,
  wherein the first portion of the composite beam comprises more than 20% of the light from the first laser and more than 20% of the light from the second laser;
  two or more reflective elements that redirect a second portion of the composite beam through a polarization rotator and toward a second surface of the polarization beam splitter and onto the output axis,
  wherein the second portion of the composite beam comprises more than 20% of the light from the first laser and more than 20% of the light from the second laser;
and
one or more lens elements disposed to direct light from the output axis toward an optical fiber that guides light to the pumped laser.

22. A method for providing light to an optical fiber, the apparatus comprising:
  energizing a first laser to direct light along a first emission axis;
  energizing at least a second laser to direct light along a second emission axis parallel to the first emission axis, wherein the first and second emission axes define a first plane P1;
  forming a composite beam wherein the light of the first and second lasers is aligned along third and fourth axes that define a second plane P2 that is substantially orthogonal to the first plane P1;
  directing at least a first portion of the composite beam toward a first surface of a polarization beam splitter and onto an output axis,
  wherein the at least the first portion of the composite beam comprises light from both the first and second lasers;
  directing a second portion of the composite beam through a polarization rotator and toward a second surface of the polarization beam splitter and onto the output axis,
  wherein the at least the second portion of the composite beam comprises light from both the first and second lasers;
  and
  directing light from the output axis toward the optical fiber.

23. The method of claim 22 wherein forming the composite beam comprises directing the light from the first laser toward a first reflective surface and directing the light from the at least the second laser to a second reflective surface that is spaced apart from the first reflective surface.

* * * * *